United States Patent
Hashemi et al.

(10) Patent No.: US 6,867,493 B2
(45) Date of Patent: Mar. 15, 2005

(54) STRUCTURE AND METHOD FOR FABRICATION OF A LEADLESS MULTI-DIE CARRIER

(75) Inventors: Hassan S. Hashemi, Laguna Niguel, CA (US); Kevin J. Cote, Phoenix, AZ (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 09/894,728

(22) Filed: Jun. 28, 2001

(65) Prior Publication Data

US 2002/0149102 A1 Oct. 17, 2002

Related U.S. Application Data

(63) Continuation-in-part of application No. 09/713,834, filed on Nov. 15, 2000.

(51) Int. Cl.$^7$ ............................................. H01L 23/34
(52) U.S. Cl. ..................................................... 257/717
(58) Field of Search ............................... 257/706, 707, 257/712, 713; 361/719, 718, 717, 720

(56) References Cited

U.S. PATENT DOCUMENTS

| | | | | |
|---|---|---|---|---|
| 5,506,755 A | * | 4/1996 | Miyagi et al. ............... 257/706 |
| 5,640,048 A | * | 6/1997 | Selna ........................... 257/738 |
| 5,646,826 A | * | 7/1997 | Katchmar ................... 361/704 |
| 5,721,454 A | | 2/1998 | Palmer |
| 5,786,628 A | * | 7/1998 | Beilstein, Jr. et al. ...... 257/684 |
| 5,808,873 A | * | 9/1998 | Celaya et al. |
| 5,814,889 A | * | 9/1998 | Gaul ........................... 257/773 |
| 5,923,084 A | * | 7/1999 | Inoue et al. ................. 257/712 |
| 5,942,797 A | * | 8/1999 | Terasawa .................... 257/723 |
| 6,097,089 A | * | 8/2000 | Gaku et al. .................. 257/712 |
| 6,191,477 B1 | * | 2/2001 | Hashemi ..................... 257/706 |
| 6,201,300 B1 | * | 3/2001 | Tseng et al. ................. 257/706 |
| 6,226,183 B1 | * | 5/2001 | Weber et al. ............... 361/704 |
| 6,236,366 B1 | | 5/2001 | Yamamoto et al. |
| 6,265,767 B1 | * | 7/2001 | Gaku et al. .................. 257/678 |
| 6,265,771 B1 | * | 7/2001 | Ference et al. ............. 257/706 |
| 6,265,772 B1 | * | 7/2001 | Yoshida ...................... 257/712 |
| 6,281,042 B1 | * | 8/2001 | Ahn et al. ................... 438/108 |
| 6,282,095 B1 | * | 8/2001 | Houghton et al. .......... 361/704 |
| 6,421,013 B1 | | 7/2002 | Chung |

FOREIGN PATENT DOCUMENTS

| | | |
|---|---|---|
| EP | 2-58358 | 2/1990 |
| EP | 9-153679 | 6/1997 |
| EP | 10-313071 | 11/1998 |
| EP | 10-335521 | 12/1998 |

OTHER PUBLICATIONS

Fujitsu Limited, Presentation slides regarding "BCC (Bump Chip Carrier)," 24 pages, 1997, United States.

* cited by examiner

Primary Examiner—David A. Zarneke
(74) Attorney, Agent, or Firm—Farjami & Farjami LLP

(57) ABSTRACT

One disclosed embodiment comprises a substrate having a top surface for receiving two or more semiconductor dies. The disclosed embodiment further comprises a printed circuit board attached to a bottom surface of the substrate and at least one via in the substrate. The at least one via provides an electrical connection between a signal bond pad of a first semiconductor die and the printed circuit board. The at least one via provides an electrical connection between a first substrate bond pad and the printed circuit board. The first substrate bond pad is connected to the first signal bond pad of the first semiconductor die by a first signal bonding wire. The at least one via also provides an electrical connection between the first signal bond pad of the first semiconductor die and a first land that is electrically connected to the printed circuit board.

23 Claims, 9 Drawing Sheets

STRUCTURE AND METHOD FOR FABRICATION OF A LEADLESS MULTI-DIE CARRIER

This application is a continuation in part of, and claims benefit of the filing date of, and hereby incorporates fully be reference, the pending parent application entitled "Leadless Chip Carrier Design and Structure" Ser. No. 09/713,834 filed Nov. 15, 2000 and assigned to the assignee of the present application.

BACKGROUND OF THE INVENTION

1. Field of the Invention

The present invention is generally in the field of semiconductor chip packaging. More specifically, the present invention is in the field of leadless chip carrier design and structure.

2. Background Art

The semiconductor fabrication industry is continually faced with a demand for smaller and more complex dies. These smaller and more complex dies must also run at higher frequencies. The requirement of smaller, more complex, and faster devices has resulted in new challenges not only in the fabrication of the die itself, but also in the manufacturing of various packages, structures, or carriers that are used to house the die and provide electrical connection to "off-chip" devices.

As an example, the demand for higher frequencies means, among other things, that "on-chip" and "off-chip" parasitics must be minimized. For example, parasitic inductance, capacitance, and resistance, which all adversely affect electrical performance of the die and its associated off-chip components must be minimized. Since RF ("Radio Frequency") semiconductor devices run at high frequencies, those devices (i.e. RF devices) constitute a significant category of devices that specially require very low parasitics.

Recently, surface mount chips and chip carriers have gained popularity relative to discrete semiconductor packages. A discrete semiconductor package typically has a large number of "pins" which may require a relatively large space, also referred to as the "footprint," to mount and electrically connect the discrete semiconductor package to a printed circuit board. Moreover, the cost and time associated with the manufacturing of the discrete semiconductor package and the cost and time associated with drilling a large number of holes in the printed circuit board are among additional reasons why alternatives such as surface mount devices and chip carriers have gained popularity.

There have been various attempts in the art to arrive at different chip carrier designs. Japanese Publication Number 10313071, published Nov. 24, 1998, titled "Electronic Part and Wiring Board Device," on which Minami Masumi is named an inventor, discloses a structure in which to dissipate heat emitted by a semiconductor device. The structure provides metallic packed through-holes formed in a wiring board that transmit heat emitted from a bare chip through a heat dissipation pattern on the bottom of the wiring board, and then to a heat dissipation plate.

Japanese Publication Number 02058358, published Feb. 27, 1990, titled "Substrate for Mounting Electronic Component," on which Fujikawa Osamu is named an inventor, discloses a substrate with a center area comprising eight thermally conductive resin-filled holes sandwiched between metal-plated top and bottom surfaces. An electronic component is then attached to the center area of the top metal-plated surface of the substrate with silver paste adhesive to improve heat dissipation and moisture resistance. Japanese Publication Number 09153679, published Jun. 10, 1997, titled "Stacked Glass Ceramic Circuit Board," on which Miyanishi Kenji is named an inventor, discloses a stacked glass ceramic circuit board comprising seven stacked glass ceramic layers. The multi-layer stacked glass ceramic circuit board further comprises a number of via holes comprising gold or copper with surface conductors on the top and bottom surfaces covering the via holes. The top conductor functions as a heat sink for an IC chip.

Japanese Publication Number 10335521, published Dec. 18, 1998, titled "Semiconductor Device," on which Yoshida Kazuo is named an inventor, discloses a thermal via formed in a ceramic substrate, with a semiconductor chip mounted above the thermal via. The upper part of the hole of the thermal via is formed in a ceramic substrate in such a manner that it becomes shallower as it goes outward in a radial direction.

A conventional chip carrier structure for mounting a chip on a printed circuit board has a number of shortcomings. For example, conventional chip carriers still introduce too much parasitics and still do not provide a low inductance and resistance ground connection to the die. Conventional chip carriers also have a very limited heat dissipation capability and suffer from the concomitant reliability problems resulting from poor heat dissipation. As an example, in high frequency applications, such as in RF applications, several watts of power are generated by a single die. Since the semiconductor die and the chip carrier are made from different materials, each having a different coefficient of thermal expansion, they will react differently to the heat generated by the die. The resulting thermal stresses can cause cracking or a separation of the die from the chip carrier and, as such, can result in electrical and mechanical failures. Successful dissipation of heat is thus important and requires a novel structure and method.

The demand for smaller and more complex dies, together with the demands for higher performance and lower cost, have additionally challenged the semiconductor fabrication industry to provide new levels of system integration. For example, the merging of computer technology with telecommunications has challenged the semiconductor fabrication industry to integrate two different technologies, i.e. analog RF technology, and digital technology, on the same chip. However, combining two different technologies, such as analog RF technology, and digital technology, on the same chip presents difficulties. For example, noisy digital circuits are difficult to integrate with noise-sensitive analog circuits.

In order to overcome the problems of combining two different technologies, such as the analog RF technology and the digital technology, two or more separate dies, instead of a single die, are housed and interconnected in the same package. There are also other reasons for housing two or more dies in the same package. For example, housing two dies in the same package enables the two dies to be interconnected by directly wire bonding of the semiconductor die signal bond pads on a first die to the semiconductor die signal bond pads on a second die. As such, the need for complex interconnect routing is avoided while a relatively short and low parasitic interconnect between the two dies is achieved.

However, the conventional multi-die packages suffer from some of the disadvantages of discrete semiconductor packages and conventional chip carriers discussed above. Thus, there exists a need for a novel and reliable structure and method to support, house, and electrically connect multiple semiconductor dies to a printed circuit board while overcoming the problems faced by discrete semiconductor packages and conventional chip carriers. As such, there is need for a level of system integration that provides for multiple dies housed and interconnected on a printed circuit board while providing low parasitics, efficient heat dissipation, and a low inductance and resistance ground.

SUMMARY OF THE INVENTION

The present invention is directed to structure and method for fabrication of a leadless multi-die carrier. The present invention discloses a structure that provides efficient dissipation of heat generated by two or more semiconductor dies. The present invention further discloses a structure that provides low parasitics, and low inductance and resistance ground connections to the two or more semiconductor dies.

In one embodiment, the present invention comprises a substrate having a top surface for receiving two or more semiconductor dies. For example, the substrate can comprise organic material such as polytetrafluoroethylene material or an FR4 based laminate material. By way of further example, the substrate can comprise a ceramic material. The present invention further comprises a printed circuit board attached to a bottom surface of the substrate.

In one embodiment, the invention comprises at least one via in the substrate. The invention's at least one via provides an electrical connection between a signal bond pad of a first semiconductor die and the printed circuit board. The at least one via can comprise an electrically and thermally conductive material such as copper. The at least one via provides an electrical connection between a first substrate bond pad and the printed circuit board. The at least one via can abut or overlap the first substrate bond pad. The first substrate bond pad is connected to the first signal bond pad of the first semiconductor die by a first signal bonding wire. The at least one via also provides an electrical connection between the first signal bond pad of the first semiconductor die and a first land that is electrically connected to the printed circuit board. Also, the at least one via can abut or overlap the first land.

The various interconnections described above in relation to the first semiconductor die can similarly exist for a second semiconductor die on the substrate.

DETAILED DESCRIPTION OF THE INVENTION

The present invention is directed to structure and method for fabrication of a leadless multi-die carrier. The following description contains specific information pertaining to various embodiments and implementations of the invention. One skilled in the art will recognize that the present invention may be practiced in a manner different from that specifically discussed in the present application. Moreover, some of the specific details of the invention are not discussed in order not to obscure the invention. The specific details not described in the present application are within the knowledge of a person of ordinary skills in the art.

The drawings in the present application and their accompanying detailed description are directed to merely example embodiments of the invention. To maintain brevity, other embodiments of the invention that use the principles of the present invention are not specifically described in the present application and are not specifically illustrated by the present drawings.

I. The Single-Die Embodiment of the Invention

Figure 1:
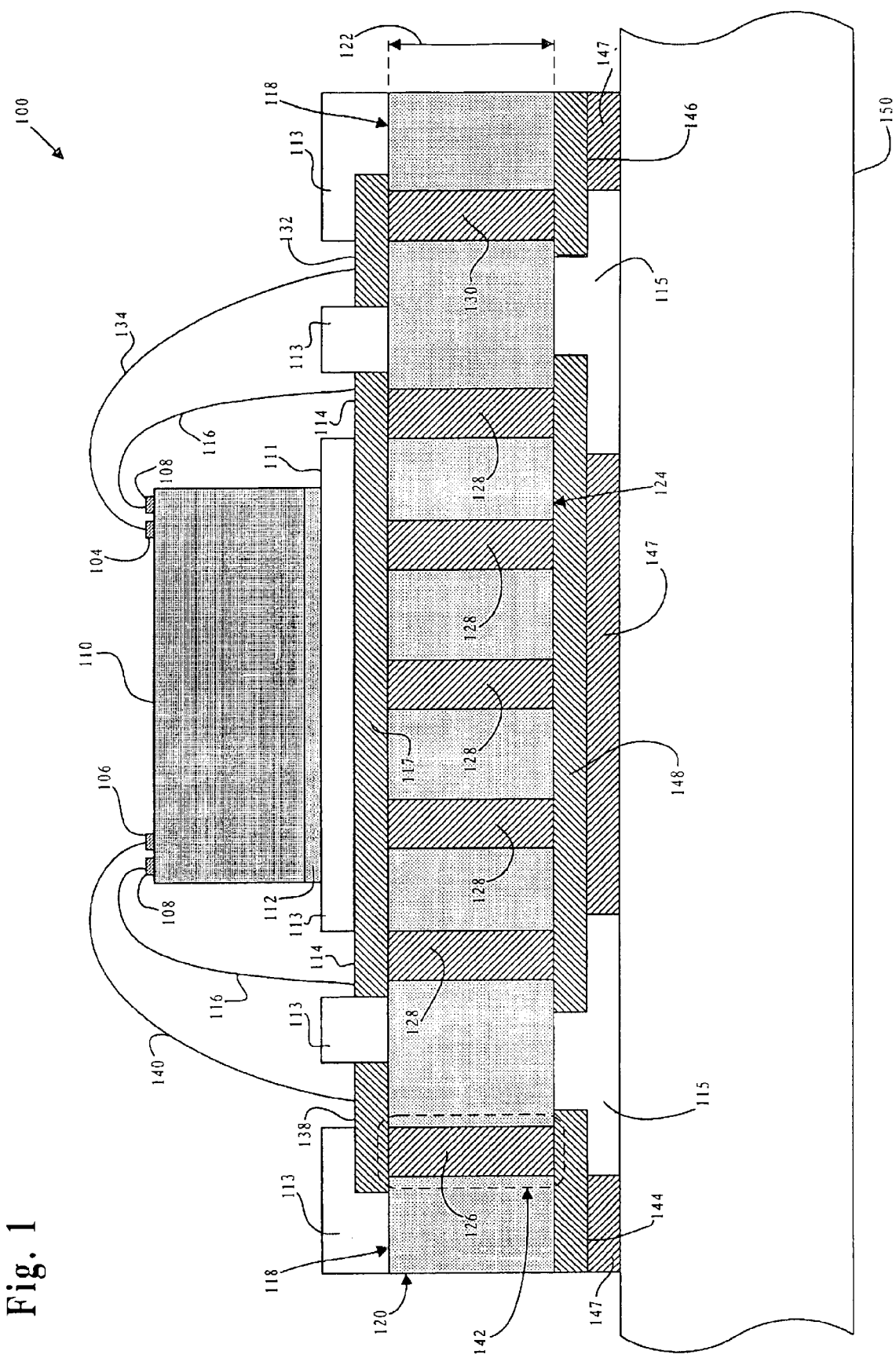
FIG. 1 illustrates a cross-sectional view of a single-die embodiment of the present invention.

Before describing the "multi-die" embodiment of the invention, the "single-die" embodiment of the invention is first discussed. Structure 100 in FIG. 1 illustrates a cross-sectional view of an exemplary structure in accordance with the single-die embodiment of the present invention. Structure 100 is shown as attached to printed circuit board ("PCB") 150 in FIG. 1. Referring to structure 100, semiconductor die 110 is attached to die attach pad 111 by die attach 112. It is noted that a "semiconductor die," such as semiconductor die 110, is also referred to as a "chip" or a "semiconductor chip" in the present application. Die attach pad 111 can be AUS-5 solder mask and it (i.e. die attach pad 111) refers to the segment of the solder mask directly below semiconductor die 110. The solder mask formation and patterning is discussed in more detail in later sections of the present application. However, die attach pad 111 may comprise materials other than solder mask. The thickness of die attach pad 111 can be, for example, 10.0 to 30.0 microns. Die attach 112 can comprise silver-filled epoxy or bismalemide. Generally die attach 112 can be an electrically conductive or electrically insulative, thermoset adhesive, or a combination thereof. However, in the present embodiment of the invention, die attach 112 is electrically and thermally conductive.

Solder mask 113 is applied to top surface 118 of substrate 120. The thickness of solder mask 113 can be, for example, 10.0 to 30.0 microns. Solder mask 113 can be AUS-5; however, solder mask 113 may comprise other materials. Solder mask 115 is applied to bottom surface 124 of substrate 120. The thickness of solder mask 115 can also be, for example,10.0 to 30.0 microns. Solder mask 115 can also be AUS-5; however, solder mask 115 may comprise other materials. Support pad 117 is fabricated on top surface 118 of substrate 120 and, in one embodiment, support pad 117 can be copper. However, support pad 117 can comprise other metals. For example, support pad 117 can be aluminum, molybdenum, tungsten, or gold. It is noted that in one embodiment of the invention, semiconductor die 110 can be soldered directly to support pad 117. The fabrication of support pad 117 will be further described below in relation to FIG. 5.

Substrate down bond area 114 is fabricated on top surface 118 of substrate 120. In structure 100 in FIG. 1, substrate down bond area 114 can comprise nickel-plated copper. Substrate down bond area 114 can further comprise a layer of gold plating over the nickel-plated copper. However, substrate down bond area 114 can comprise other metals. For example, substrate down bond area 114 can be aluminum, molybdenum, tungsten, or gold. The fabrication of substrate down bond area 114 will be further described below in relation to FIG. 5. A first end of down bonding wire 116 is bonded to semiconductor die ground bond pad 108, on semiconductor die 110. A second end of down bonding wire 116 is bonded to substrate down bond area 114. Down bonding wire 116 can be gold, or can comprise other metals such as aluminum. The diameter of down bonding wire 116 can be approximately 30.0 microns or other diameter of choice.

Substrate 120 can comprise a two-layer organic laminate such as polytetrafluoroethylene. However, substrate 120 can comprise other organic materials such as FR4 based laminate. In one embodiment of the present invention, substrate 120 can be a ceramic material. In structure 100 in FIG. 1, thickness 122 of substrate 120 is approximately 200.0 microns; however, the thickness of substrate 120 can be different in other embodiments of the invention.

Continuing with FIG. 1, vias 128, also referred to as a first plurality of vias, and via 126 and via 130, also referred to as a second plurality of vias, are situated within substrate 120. Via 126, via 130, and vias 128 extend from top surface 118 to bottom surface 124 of substrate 120. Vias 126, via 130, and vias 128 can comprise a thermally conductive material. Vias 126, via 130, and vias 128 can comprise copper and, in fact, in exemplary structure 100, via 126, via 130, and vias 128 are filled with copper. However, via 126, via 130, and vias 128 can be filled with other metals without departing from the scope of the present invention. In another embodiment of the present invention, via 126, via 130, and vias 128 may not be completely filled with a metal. Generally, vias 128, via 126, and via 130 have similar structures. As such, and by way of an illustrative example, the structure of exemplary via 126 will be described in greater detail in relation to FIGS. 2A and 2B, and specifically with respect to the region enclosed by dashed line 142 (which corresponds to the region enclosed by dashed line 242 in FIG. 2B).

As shown in FIG. 1, a first end of signal bonding wire 134 is bonded to semiconductor die signal bond pad 104 on semiconductor die 110. A second end of signal bonding wire 134 is bonded to substrate signal bond pad 132. Signal bonding wire 134 can be gold or can comprise other metals such as aluminum. The diameter of signal bonding wire 134 can be 30.0 or other diameter of choice. As further shown in FIG. 1, a first end of signal bonding wire 140 is bonded to semiconductor die signal bond pad 106 on semiconductor die 110. A second end of signal bonding wire 140 is bonded to substrate signal bond pad 138. Signal bonding wire 140 can be gold or can comprise other metals such as aluminum. The diameter of signal bonding wire 140 can be 30.0 or other diameter of choice.

In FIG. 1, substrate signal bond pad 132 is fabricated on top surface 118 of substrate 120. In structure 100, substrate signal bond pad 132 can comprise nickel-plated copper. Substrate signal bond pad 132 can further comprise a layer of gold plating over the nickel-plated copper. However, substrate signal bond pad 132 can comprise other metals. For example, substrate signal bond pad 132 can be aluminum, molybdenum, tungsten, or gold. The fabrication of substrate signal bond pad 132 will be further described below in relation to FIG. 5. In structure 100 in FIG. 1, substrate signal bond pad 132 overlaps via 130. In another embodiment of the present invention, instead of overlapping via 130, substrate signal bond pad 132 "abuts" via 130.

Similar to substrate signal bond pad 132, substrate signal bond pad 138 is fabricated on top surface 118 of substrate 120. In structure 100, substrate signal bond pad 138 can comprise nickel-plated copper. Substrate signal bond pad 138 can further comprise a layer of gold plating over the nickel-plated copper. However, substrate signal bond pad 138 can comprise other metals. For example, substrate signal bond pad 138 can be aluminum, molybdenum, tungsten, or gold. The fabrication of substrate signal bond pad 138 will be further described below in relation to FIG. 5. In structure 100, substrate signal bond pad 138 overlaps via 126. In another embodiment of the present invention, substrate signal bond pad 138 abuts via 126.

Also shown in FIG. 1, land 144 is fabricated on bottom surface 124 of substrate 120. In structure 100, land 144 can comprise copper; however, land 144 can comprise other metals such as aluminum, molybdenum, tungsten, or gold. The fabrication of land 144 will be further described below in relation to FIG. 5. Land 144 is attached to PCB 150 by solder 147. However, other methods known in the art may be used to attach land 144 to PCB 150. In structure 100, land 144 overlaps via 126. In another embodiment of the present invention, instead of overlapping via 126, land 144 abuts via 126.

Similar to land 144, land 146, is fabricated on bottom surface 124 of substrate 120. In structure 100, land 146 can be copper; however, land 146 can comprise other metals such as aluminum, molybdenum, tungsten, or gold. The fabrication of land 144 will be further described below in relation to FIG. 5. In structure 100 in FIG. 1, land 146 is attached to PCB 150 by solder 147. However, other methods known in the art may be used to attach land 146 to PCB 150. In structure 100, land 146 overlaps via 130. In another embodiment of the present invention, land 144 can abut via 126.

Further shown in FIG. 1, heat spreader 148 is fabricated on bottom surface 124 of substrate 120. In structure 100, heat spreader 148 can be copper; however, heat spreader 148 can comprise other metals such as aluminum, molybdenum, tungsten, or gold. In exemplary structure 100, heat spreader 148 is attached to PCB 150 by solder 147. However, other methods known in the art may be used to attach heat spreader 148 to PCB 150. The fabrication of heat spreader 148 will be discussed in detail in relation to FIG. 5.

Figure 2A:
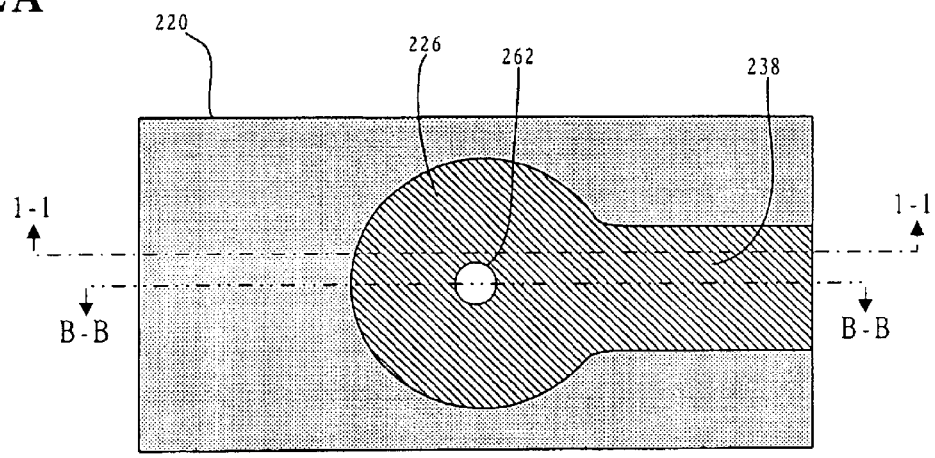
FIG. 2A illustrates a top view of a portion of an embodiment of the present invention.
Figure 2B:
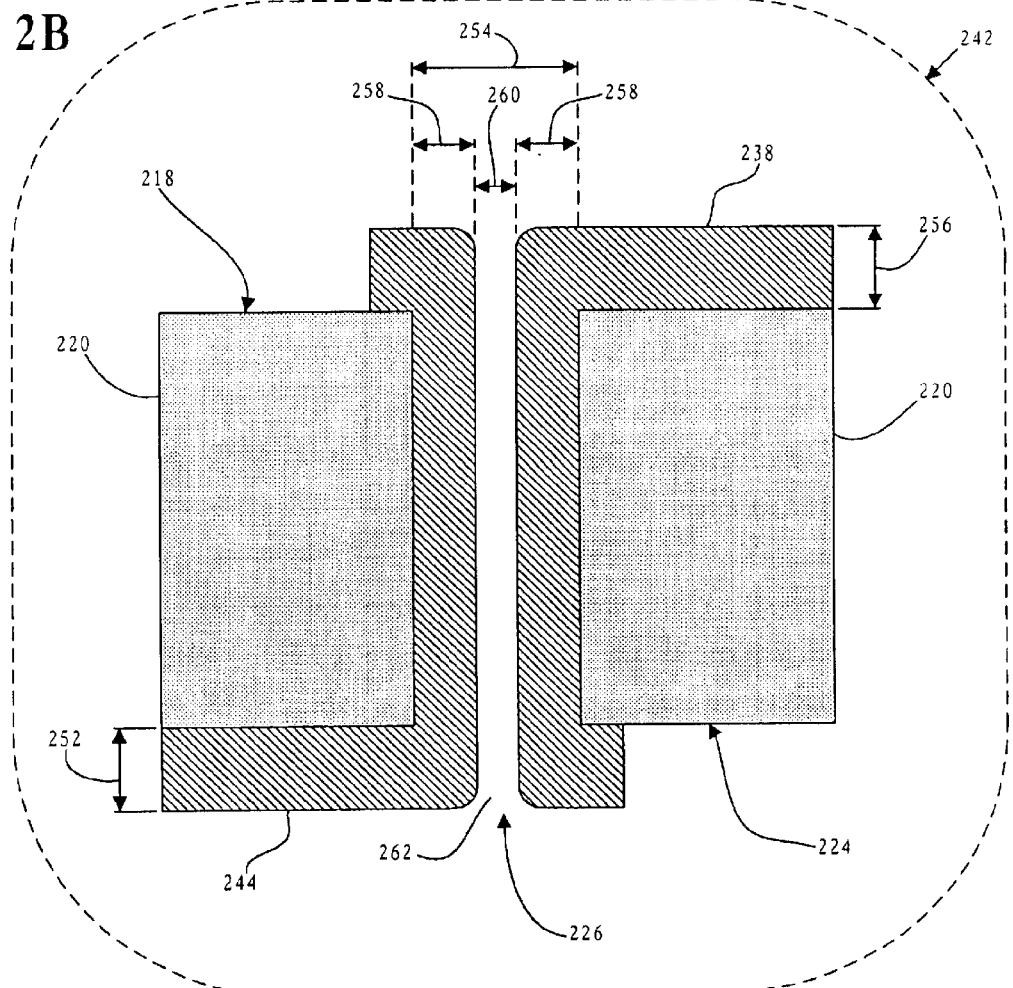
FIG. 2B illustrates a cross-sectional view of a portion of an embodiment of the present invention.

FIG. 2A shows a top view of region 242 in FIG. 2B, which corresponds to region 142 in FIG. 1. In particular, substrate 220, via 226, and substrate signal bond pad 238, respectively, correspond to substrate 120, via 126, and substrate signal bond pad 138 in FIG. 1. FIG. 2A also shows via hole 262. Via hole 262 cannot be seen in FIG. 1 which is a cross-sectional view along line 1—1 of FIG. 2A. However, via hole 262 can be seen in FIG. 2B since FIG. 2B is a cross-sectional view along line B—B of FIG. 2A. Via 226, bond pad 238, and via hole 262 will be described in detail below in relation to FIG. 2B.

FIG. 2B shows a cross-sectional view of region 242 along line B—B of FIG. 2A. However, region 142 in FIG. 1 shows a cross-sectional view along line 1—1 of FIG. 2A. In particular, top surface 218, substrate 220, bottom surface 224, via 226, substrate signal bond pad 238, and land 244 correspond, respectively, to top surface 118, substrate 120, bottom surface 124, via 126, substrate signal bond pad 138, and land 144 in FIG. 1.

In FIG. 2B, land pad thickness 252 can be approximately 12.7 to 30.0 microns. Via drill diameter 254 can be 150.0 microns while bond pad thickness 256 can be approximately 12.7 to 30.0 microns. Via wall thickness 258 can be approximately 20.0 microns. Via hole diameter 260 can be approximately 110.0 microns. It is noted that, for the purpose of ease of illustration, the various dimensions in FIGS. 2A and 2B are not drawn to scale.

The fabrication of via 226 begins with substrate 220. In one embodiment of the present invention, copper can be laminated on top surface 218 and bottom surface 224 of substrate 220. The thickness of the copper laminated on top surface 218 and bottom surface 224 of substrate 220 can be, for example, 15.0 microns. However, other metals may be laminated on top surface 218 and bottom surface 224 of substrate 220. For example, the metal laminated on top surface 218 and bottom surface 224 of substrate 220 can be aluminum, molybdenum, tungsten, or gold. Next, a via opening having via drill diameter 254 is drilled through substrate 220 at a predetermined location. Substrate 220 is then plated with copper to produce a layer of copper on the inside of the via opening corresponding to via wall thickness 258. However, substrate 220 may be plated with other metals. Thus, via 226 is fabricated having via hole diameter 262 as shown in FIGS. 2A and 2B. The process illustrated above to fabricate via 226 also applies to the fabrication of via 130 and vias 128 in structure 100 in FIG. 1.

Figure 3:
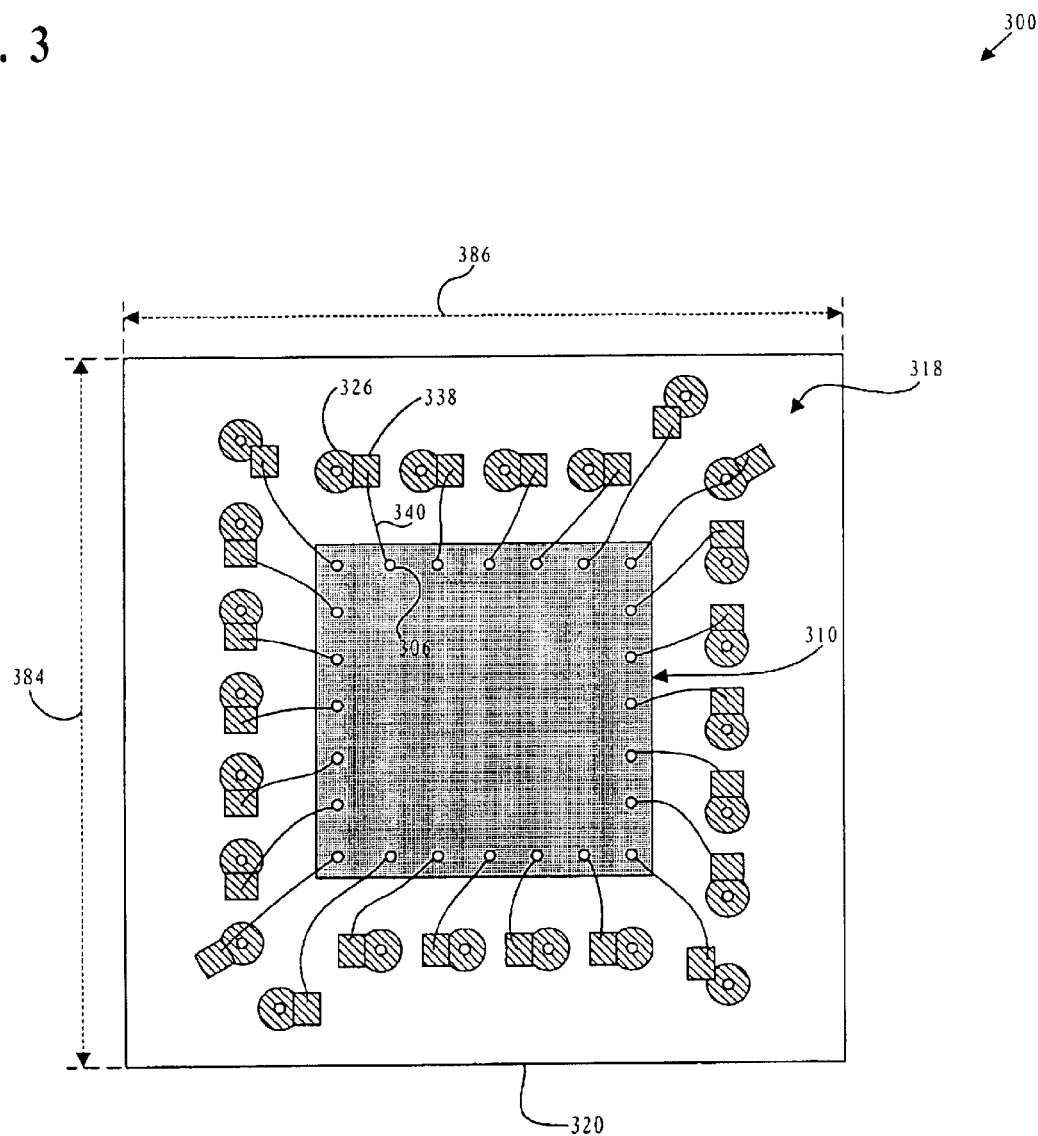
FIG. 3 illustrates a top view of an embodiment of the present invention after completion of a "saw singulation" step.

Structure 300 in FIG. 3 illustrates a top view of an exemplary structure in accordance with one embodiment of the present invention after completion of a "saw singulation" step which, briefly, involves dicing substrate 120 (FIG. 1) so as to achieve a "singulated" structure such as structure 100 in FIG. 1, corresponding to structure 300 in FIG. 3. The saw singulation step is one of the last steps in a process that is described in more detail in relation to FIG. 5. Structure 300 thus comprises substrate 320 corresponding to substrate 120 in FIG. 1. However, in contrast to structure 100 in FIG. 1, in structure 300 substrate bond pads abut, instead of overlap, the vias. For example, substrate signal bond pad 338 is shown as abutting, and not overlapping, via 326. This is in contrast to substrate signal bond pad 138 in FIG. 1, which is shown as overlapping, and not abutting, via 126. Continuing with structure 300, a first end of bonding wire 340 is bonded to substrate signal bond pad 338. A second end of bonding wire 340 is bonded to semiconductor die signal bond pad 306 on semiconductor die 310. It is noted that in FIG. 3, only via 326, substrate signal bond pad 338, bonding wire 340, and semiconductor die signal bond pad 306 are illustrated to preserve simplicity.

The shape of structure 300 in FIG. 3 can be square. For example, side 384 and side 386 of substrate 320 in singulated structure 300 can each be 4.0 millimeters. By way of other examples, other square-shaped "package sizes" can be 5.0 millimeters by 5.0 millimeters, 6.0 millimeters by 6.0 millimeters, or 7.0 millimeters by 7.0 millimeters. In another embodiment, the shape of structure 300 can be rectangular. The "package size" of a rectangular-shaped embodiment can be 3.9 millimeters by 4.9 millimeters. By way of other examples, other "package sizes" of the rectangular-shaped embodiment can be 4.4 millimeters by 6.5 millimeters or 4.4 millimeters by 7.8 millimeters.

Figure 4:
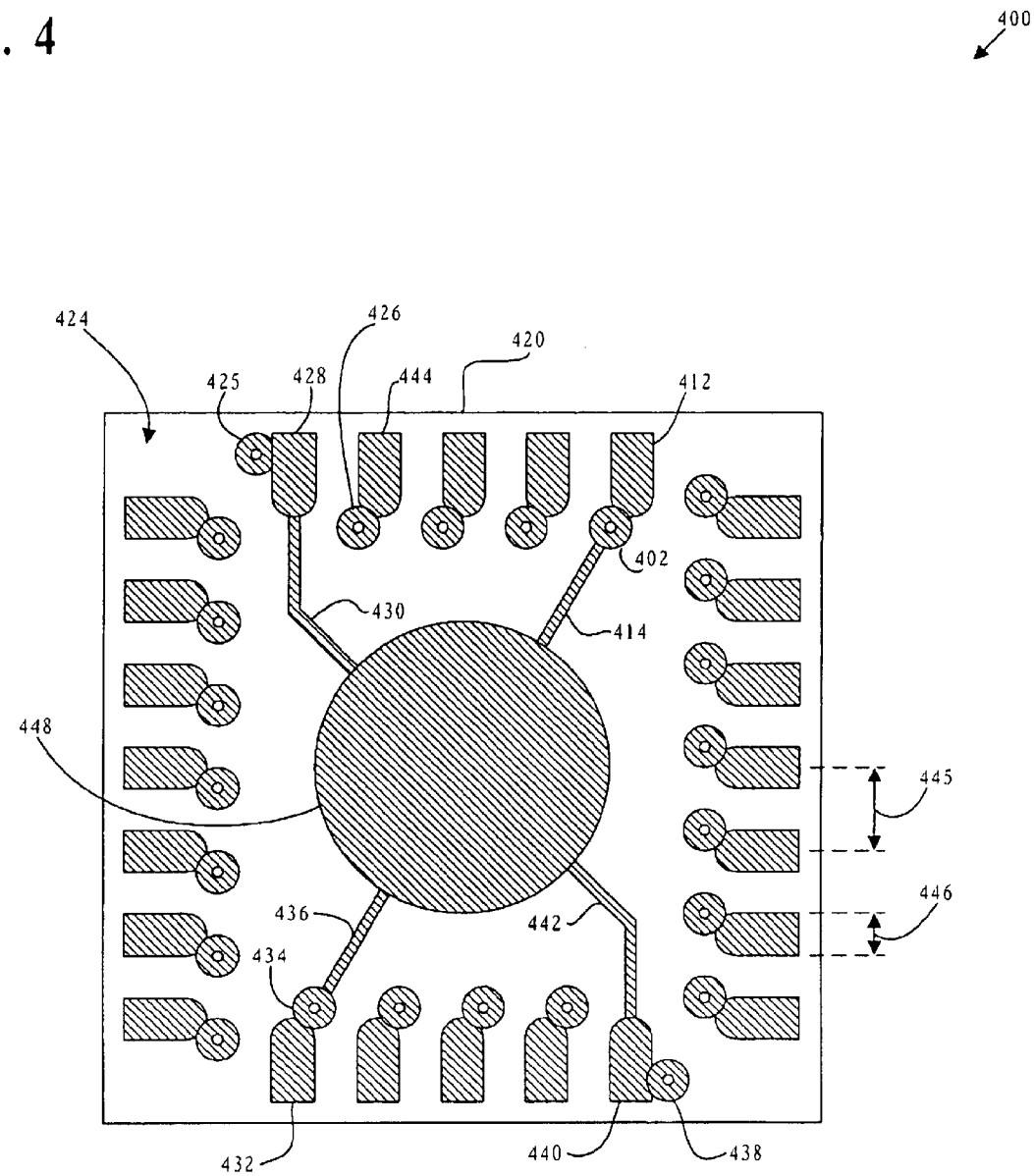
FIG. 4 illustrates a bottom view of an embodiment of the present invention after completion of a "saw singulation" step.

Structure 400 in FIG. 4 illustrates a bottom view of an exemplary structure in accordance with one embodiment of the present invention after completion of a "saw singulation" step. Structure 400 comprises substrate 420 corresponding to substrate 120 in FIG. 1. However, in contrast to structure 100 in FIG. 1, in structure 400 lands abut, instead of overlap, the vias. For example, land 444 is shown abutting, and not overlapping, via 426. This is in contrast to land 144 in FIG. 1, which is shown as overlapping, and not abutting, via 126. Additionally, traces that connect lands and vias to a heat spreader, such as traces 414, 430, 436, and 442 in FIG. 4, are not utilized in structure 100 in FIG. 1.

FIG. 4 shows bottom surface 424 of substrate 420. Lands 412, 428, 432, 440 and 444, respectively, abut vias 402, 425, 434, 438 and 426. Trace 414 connects via 402 and heat spreader 448. Trace 436 connects via 434 and heat spreader 448. Trace 430 connects land 428 and heat spreader 448. Trace 442 connects land 440 and heat spreader 448. Therefore, vias 402, 425, 434, and 438, respectively, are connected by traces 414, 430, 436, and 442 to heat spreader 448. Land pitch 445 can be, for example, 500.0 microns. Land width 446 can be, for example, 250.0 microns. It is noted that in FIG. 4, only vias 402, 425, 426, 434, and 438 and lands 412, 428, 432, 440, and 444 are illustrated to preserve simplicity.

In another embodiment, traces, such as traces 414, 430, 436, and 442 in FIG. 4, are not used to connect vias and lands directly to a heat spreader, such as heat spreader is 448 in FIG. 4. In that embodiment, lands, such as lands 412, 428, 432, and 440 in FIG. 4, would not be connected to a ground, such as heat spreader 448 in FIG. 4, but would be used as "signal" lands.

Figure 5:
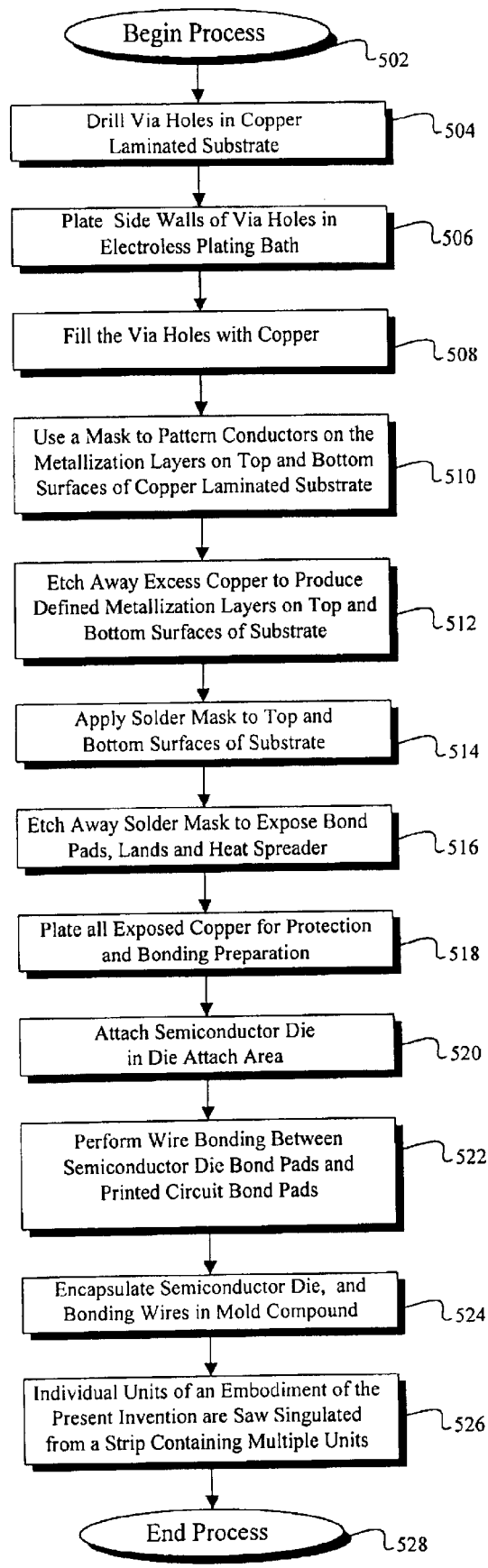
FIG. 5 illustrates a flow chart of an exemplary process by which an embodiment of the present invention is fabricated.

Referring to FIG. 5, an example of a process by which structure 100 in FIG. 1 is fabricated is now discussed. At step 502 the process begins. At step 504, via openings are drilled in a strip of copper laminated substrate. For example, the strip can be an 18-inch by 24-inch panel of copper laminated substrate. Substrate 120 in FIG. 1 corresponds to a section of the strip of the copper laminated substrate. Typically, multiple units of structure 100 are assembled on the strip of copper laminated substrate. In a later step in the assembly process, multiple assembled units of structure 100 are separated into individual units. The diameter of the via openings drilled in the copper laminated substrate can be approximately 150.0 microns.

Typically, all via openings are drilled at once using multiple diamond bits. At step 506, the sidewalls of the via openings are plated with copper in an electroless plating bath. By way of background, electroless plating refers to a method of plating that involves the deposition of metals such as copper, nickel, silver, gold, or palladium on the surface of a variety of materials by means of a reducing chemical bath. As a result of the electroless plating bath, the vias provide electrical and thermal conduction between the top and bottom surfaces of the copper laminated substrate. In one embodiment, after completion of the electroless plating process, the via hole diameter, such as via hole diameter 260 in FIG. 2B, is approximately 110.0 microns.

At step 508, the vias openings are filled with copper. Adding additional copper to the via openings increases the thermal conductivity of the vias by providing a larger cross-sectional area for thermal flow. Also, providing a larger cross-sectional area for electrical current flow increases the electrical conductivity of the vias. In the present embodiment, the via openings are partially (or almost completely) filled with copper, while in another embodiment the via openings are completely filled with copper. In one embodiment of the invention, the vias are filled with tungsten. In that embodiment, the tungsten-filled vias are strong enough to allow bonding directly onto the vias.

At step 510, a mask is used to pattern conductors on the metallization layers on the top and bottom surfaces of the substrate. In the present exemplary embodiment, the metallization layers can be copper. At step 512, the excess copper is etched away, resulting in a defined metal interconnect or metal trace pattern, also referred to as a printed circuit, on the top and bottom surfaces of the substrate. For example, in structure 400 in FIG. 4, a patterned metallization layer on bottom surface 424 includes, among other things, heat spreader 448, lands 412, 418, 428, 432, and 440, and traces 414, 430, 436, and 442.

In step 514, solder mask is applied to the top and bottom surfaces of the substrate, thereby covering the exposed patterned copper on the top and bottom surfaces of the substrate. Solder mask improves the adhesive quality of the die attach used to secure the semiconductor die to the top surface of the substrate. For example, in structure 100 in FIG. 1, solder mask 113 improves the adhesive quality of die attach 112 in securing semiconductor die 110 to top surface 118 of substrate 120. Solder mask also prevents contamination of the substrate signal bond pads, substrate down bond areas, and lands.

In step 516, solder mask is etched away to expose copper in the printed circuit areas where bonding and soldering would take place. For example, solder mask is etched away to expose substrate down bond area 114, substrate signal bond pads 132 and 138, lands 144 and 146, and heat spreader 148 in FIG. 1. In step 518, the exposed copper in the printed circuit areas, where bonding and soldering would take place, is plated with a layer of nickel, followed by a layer of gold plating on top of the nickel plated copper. The gold/nickel plating protects the exposed copper from oxidation. Also, the gold/nickel plating prepares the exposed copper for bonding at the bond pads and substrate down bond areas of the printed circuit, such as substrate signal bond pads 132 and 138 and substrate down bond area 114 in FIG. 1. Additionally, the gold/nickel plating prepares the exposed copper for soldering at the printed circuit lands and heat spreader, such as lands 144 and 146 and heat spreader 148 in FIG. 1.

At step 520, a semiconductor die is attached to the die attach pad with a die attach material. In structure 100 in FIG. 1, for example, semiconductor die 110 is attached to die attach pad 111 with die attach 112. As stated above, die attach pad 111 can be AUS-5 solder mask and it (i.e. die attach pad 111) refers to the segment of the solder mask directly below semiconductor die 110. The die attach material, for example, attach 112 shown in FIG. 1, can comprise silver-filled epoxy or bismalemide. Generally the die attach material can be an electrically conductive or electrically insulative, thermoset adhesive, or a combination thereof. In another embodiment of the present invention, the semiconductor die can be directly soldered to a support pad, such as support pad 117 in FIG. 1.

At step 522, wire bonding is performed between semiconductor die bond pads, such as semiconductor die signal bond pads 104 and 106 in FIG. 1, and printed circuit bond pads, such as substrate signal bond pads 132 and 138 in FIG. 1. In structure 300 in FIG. 3, for example, wire bonding is performed between semiconductor die bond pad 306 and substrate signal bond pad 338. In structure 100 in FIG. 1, the bonding wires used for wire bonding, such as signal bonding wires 134 and 140, can comprise gold. At step 524, the semiconductor die and the bonding wires, such as semiconductor die 110, signal bonding wires 134 and 140, and down bonding wire 116 in FIG. 1, are encapsulated in an appropriate mold compound. The mold compound provides protection from chemical contamination or physical damage in subsequent manufacturing processes and during use. The mold compound, for example, can comprise various chemical compounds, such as multifunctional epoxy, novolac, and biphenyl resin, or a combination thereof.

At step 526, the strip containing multiple assembled units of structure 100 is saw singulated into individual units. In saw singulation, individual assembled units of structure 100 are diced from the strip containing multiple assembled units of structure 100 to result in a large number of structures such as structure 100. It is noted that the process described by reference to FIG. 5 is only one method of fabricating structure 100 in FIG. 1. It is also noted that variations and modifications to the overall method or to each individual step discussed in relation to FIG. 5 are obvious to a person of ordinary skill in the art. At step 528, the exemplary process by which structure 100 in FIG. 1 is fabricated ends.

Figure 6:
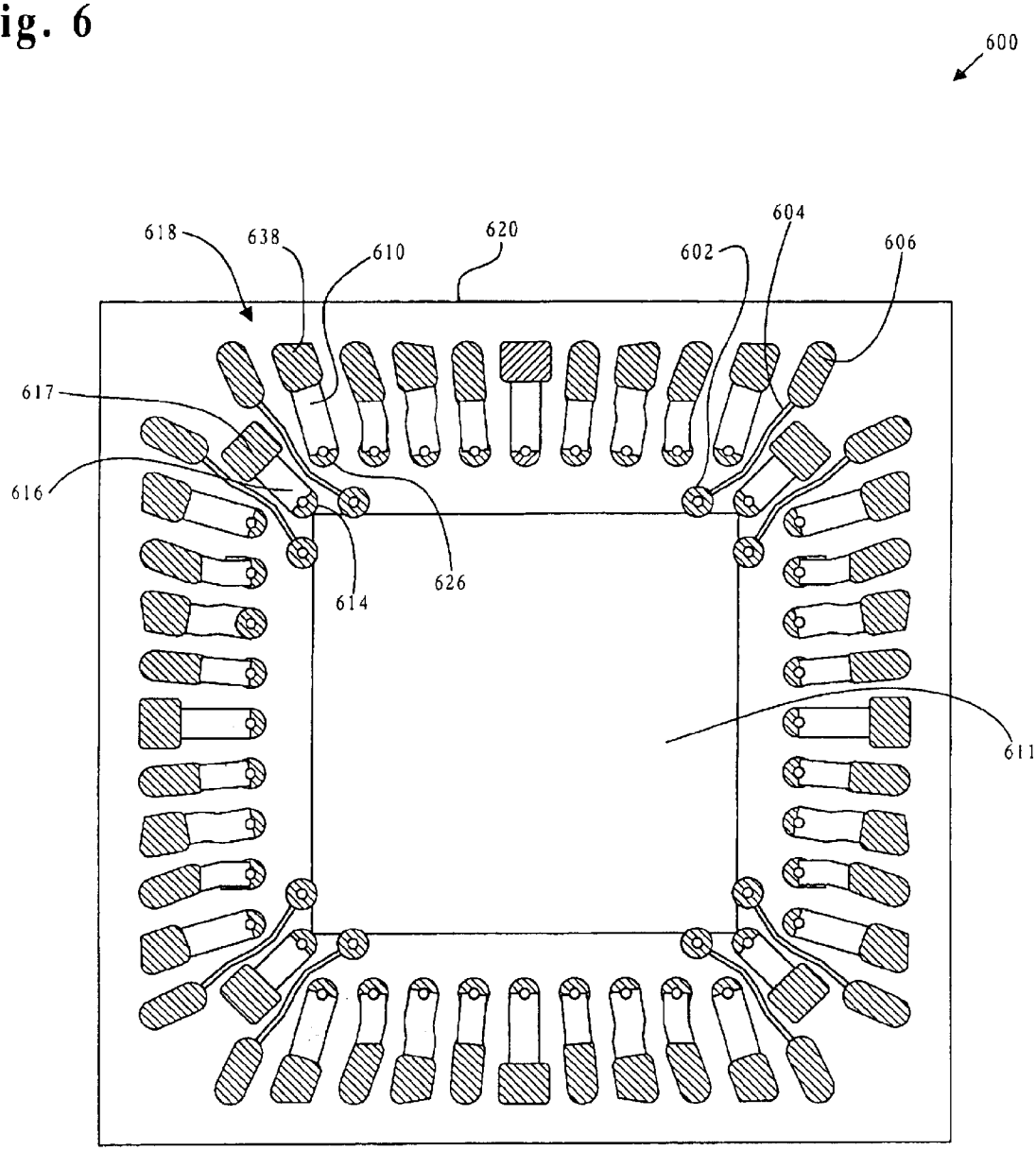
FIG. 6 illustrates a top view of an embodiment of the present invention after completion of a "saw singulation" step.

Structure 600 in FIG. 6 illustrates a top view of an exemplary structure in accordance with one embodiment of the present invention after completion of a "saw singulation" step. However, a semiconductor die and bonding wires are not shown in FIG. 6. Structure 600 comprises substrate 620 corresponding to substrate 120 in FIG. 1. However, in contrast to structure 100 in FIG. 1, in structure 600 substrate bond pads are connected to vias by traces. For example, trace 610 connects substrate signal bond pad 638 and via 626. In contrast, in structure 100 in FIG. 1, the bond pads overlap the vias. For example, substrate signal bond pad 138 overlaps via 126 in FIG. 1.

FIG. 6 shows top surface 618 of substrate 620. Trace 604 connects substrate bond pad 606 and via 602. Trace 610 connects substrate bond pad 638 and via 626. Trace 616 connects substrate bond pad 617 and via 614. FIG. 6 also shows die attach area 622. It is noted that in FIG. 6, only vias 602, 626, and 614, traces 604, 610, and 616, and substrate bond pads 606, 617, and 638 are illustrated to preserve simplicity.

In structure 600 in FIG. 6, via 602 is situated adjacent to die attach area 622. Via 602 can be connected to a common ground connection, such as support pad 117 in structure 100 in FIG. 1. Via 614 is situated at a corner of die attach area 622. In structure 600, via 614 can be connected to a common ground connection, not shown in FIG. 6, such as support pad 117 in structure 100 in FIG. 1. In structure 600 in FIG. 6, "peripheral" vias, such as via 626, typically function as "signal" vias.

In structure 600 in FIG. 6, traces 604, 610, and 616, respectively, connect substrate bond pads 606, 638, and 617 to vias 602, 626, and 614. Traces 604, 610, and 616 have different lengths. Thus, substrate bond pads 606, 638, and 617, respectively, are at different distances from vias 602, 626, and 614. Also, trace 604 and trace 616 have different thickness. Structure 600 in FIG. 6 provides design flexibility in the utilization of various substrate bond pad and via locations, trace lengths and trace thickness.

II. The Multi-Die Embodiment of the Invention

An embodiment of the invention is directed to a multi-die (or a multi-chip) leadless carrier. In this embodiment, two or more dies are utilized in the invention's leadless chip carrier. As stated above, housing two or more dies in the same "package" can be advantageous as compared to having the dies separately packaged. Moreover, the option of housing two or more dies in the same package can also be advantageous relative to the option of including the functionality of the two or more dies in a single die. For example, as stated above, combining dissimilar functions, such as digital functions and RF analog functions, in a single die may result in an unacceptable amount of coupling of noise generated by the digital circuits, which are less sensitive to small variations of voltage levels, to RF analog circuits, which are quite sensitive to small voltage variations. As such, it is often preferable to have two separate dies separately contain the digital and analog RF functions.

Figure 7:
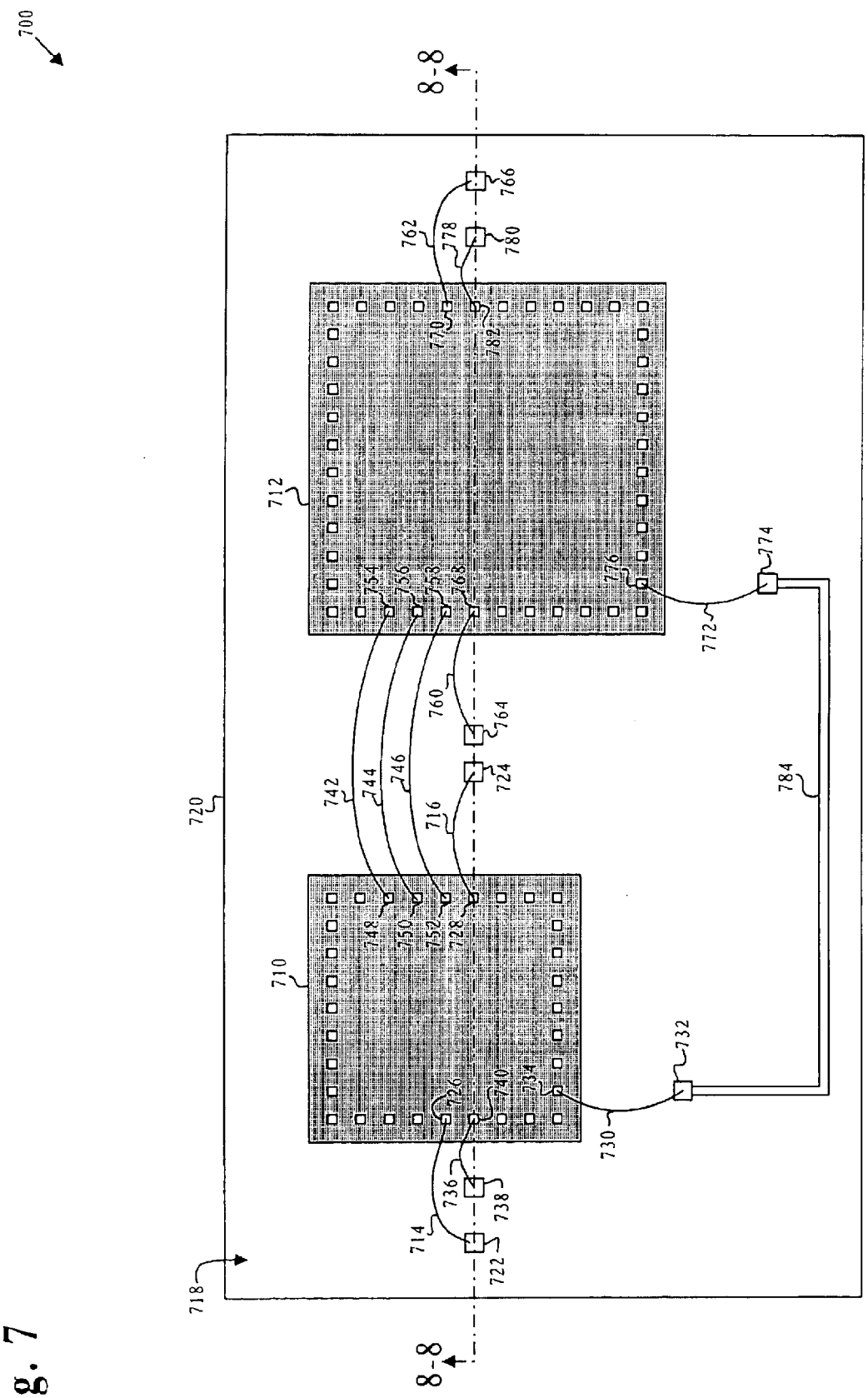
FIG. 7 illustrates a top view of a multi-die embodiment of the present invention.

Structure 700 in FIG. 7 illustrates a top view of an exemplary structure in accordance with the "multi-die" embodiment of the present invention after completion of a "saw singulation" step. Structure 700 comprises substrate 720 corresponding to substrate 120 in FIG. 1. However, in contrast to structure 100 in FIG. 1, structure 700 includes two semiconductor dies, i.e. semiconductor die 710 and semiconductor die 712, on top surface 718 of substrate 720.

In FIG. 7, a first end of signal bonding wire 714 is bonded to semiconductor die signal bond pad 726 on semiconductor die 710, and a second end of signal bonding wire 714 is bonded to substrate signal bond pad 722. Similarly, a first end of signal bonding wire 716 is bonded to semiconductor die signal bond pad 728 on semiconductor 710, and a second end of signal bonding wire 716 is bonded to substrate signal bond pad 724. Also, a first end of signal bonding wire 730 is bonded to semiconductor die signal bond pad 734 on semiconductor die 710, and a second end of signal bonding wire 730 is bonded to substrate signal bond pad 732.

Substrate signal bond pads 722, 724, and 732 are fabricated on top surface 718 of substrate 720. In structure 700, substrate signal bond pads 722, 724, and 732 can comprise nickel-plated copper. Substrate signal bond pads 722, 724, and 732 can further comprise a layer of gold plating over the nickel-plated copper. However, substrate signal bond pads 722, 724, and 732 can also comprise other metals, such as aluminum, molybdenum, tungsten, or gold. Signal bonding wires 714, 716, and 730 can be gold or can comprise other metals such as aluminum. The diameter of signal bonding wires 714, 716, and 730 can be 30.0 microns or other diameter of choice.

Also shown in FIG. 7, a first end of down bonding wire 736 is bonded to semiconductor die ground bond pad 740 on semiconductor die 710, and a second end of down bonding wire 736 is bonded to substrate down bond area 738. Substrate down bond area 738 is fabricated on top surface 718 of substrate 720. Substrate down bond area 738, which corresponds to substrate down bond area 114 in structure 100 in FIG. 1, generally comprises the same material as down bond area 114. In structure 700 in FIG. 7, substrate down bond area 738 can comprise nickel-plated copper, and can further comprise a layer of gold plating over the nickel-plated copper. However, substrate down bond area 738 can also comprise other metals, such as aluminum, molybdenum, tungsten, or gold. Down bonding wire 736 can be gold or can comprise other metals such as aluminum. Similar to signal bonding wires 714, 716, and 730 discussed above, the diameter of down bonding wire 736 can also be 30.0 microns or other diameter of choice.

Further shown in FIG. 7, a first end of signal bonding wire 742 is bonded to semiconductor die signal bond pad 748 on semiconductor die 710, and a second end of signal bonding wire 742 is bonded to semiconductor die signal bond pad 754 on semiconductor die 712. Similarly, a first end of signal bonding wire 744 is bonded to semiconductor die signal bond pad 750 on semiconductor die 710, and a second end of signal bonding wire 744 is bonded to semiconductor die signal bond pad 756 on semiconductor die 712. Also, a first end of signal bonding wire 746 is bonded to semiconductor die signal bond pad 752 on semiconductor die 710, and a second end of signal bonding wire 746 is bonded to semiconductor die signal bond pad 758 on semiconductor die 712. Similar to signal bonding wires 714, 716, and 730 discussed above, signal bonding wires 742, 744, and 746 can be gold or can comprise other metals such as aluminum, and the diameter of signal bonding wires 742, 744, and 746 can be 30.0 microns or other diameter of choice.

In FIG. 7, a first end of signal bonding wire 760 is bonded to semiconductor die signal bond pad 768 on semiconductor die 712, and a second end of signal bonding wire 760 is bonded to substrate signal bond pad 764. Also, a first end of signal bonding wire 762 is bonded to semiconductor die signal bond pad 770 on semiconductor die 712, and a second end of signal bonding wire 762 is bonded to substrate signal bond pad 766. Similarly, a first end of signal bonding wire 772 is bonded to semiconductor die signal bond pad 776 on semiconductor die 712, and a second end of signal bonding wire 772 is bonded to substrate signal bond pad 774. Similar to substrate signal bond pads 722, 724, and 732 discussed above, substrate signal bond pads 764, 766, and 774 are fabricated on top surface 718 of substrate 720. In structure 700, substrate signal bond pads 764, 766, and 774 can comprise nickel-plated copper. Substrate signal bond pads 764, 766, and 774 can further comprise a layer of gold plating over the nickel-plated copper. However, substrate signal bond pads 764, 766, and 774 can also comprise other metals, such as aluminum, molybdenum, tungsten, or gold. Similar to signal bonding wires 714, 716, and 730 discussed above, signal bonding wires 760, 762, and 772 can be gold or can comprise other metals such as aluminum. The diameter of signal bonding wires 760, 762, and 772 can also be 30.0 microns or other diameter of choice.

Also shown in FIG. 7, a first end of down bonding wire 778 is bonded to semiconductor die ground bond pad 782 on semiconductor die 712, and a second end of down bonding wire 778 is bonded to substrate down bond area 780. Similar to substrate down bond area 738, substrate down bond area 780 is fabricated on top surface 718 of substrate 720. Substrate down bond area 780, which corresponds to substrate down bond area 114 in structure 100 in FIG. 1, generally comprises the same material as down bond area 114. In structure 700 in FIG. 7, substrate down bond area 780 can comprise nickel-plated copper, and can further comprise a layer of gold plating over the nickel-plated copper. However, substrate down bond area 780 can also comprise other metals, such as aluminum, molybdenum, tungsten, or gold. Down bonding wire 778 can comprise gold or other metals such as aluminum, and the diameter of down bonding wire 778 can also be 30.0 microns or other diameter of choice.

Further shown in FIG. 7, trace 784 is fabricated on top surface 718 of substrate 720, and connects substrate signal bond pad 732 and substrate signal bond pad 774. In structure 700, trace 784 can be copper; however, trace 784 can comprise other metals, such as aluminum, molybdenum, tungsten, or gold. It is noted that in FIG. 7, only substrate signal bond pads 722, 724, 732, 764, 766, and 774, substrate down bond areas 738 and 780, semiconductor die signal bond pads 726, 728, 748, 750, and 752 on semiconductor die 710, semiconductor die ground bond pad 740 on semiconductor die 710, semiconductor die signal bond pads 754, 756, 758, 768, and 770 on semiconductor die 712, and semiconductor die ground pad 782 on semiconductor die 712 are specifically discussed herein to preserve brevity.

Figure 8:
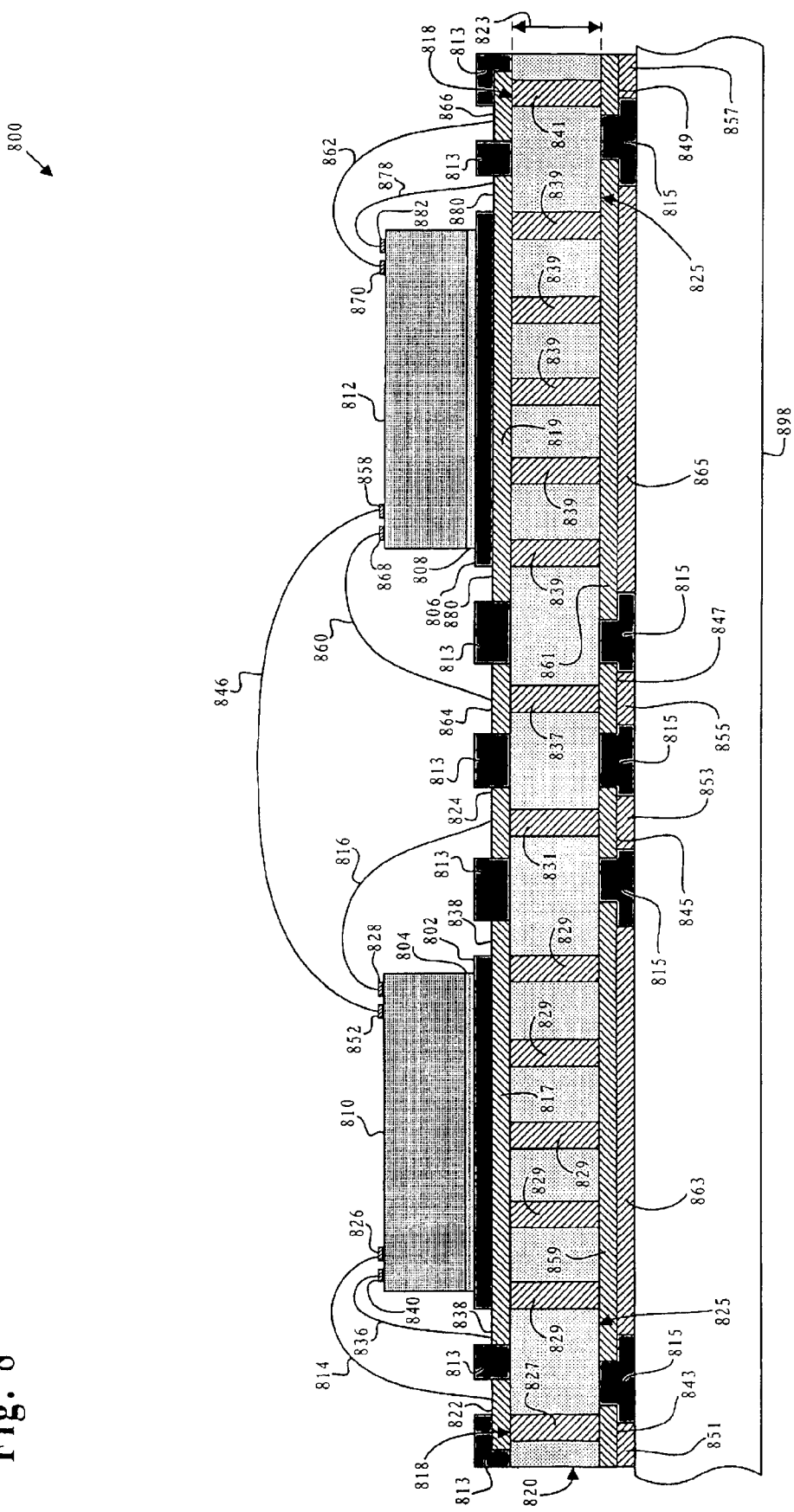
FIG. 8 illustrates a cross-sectional view of a multi-die embodiment of the present invention utilizing separate heat spreaders.

Structure 800 in FIG. 8 corresponds to a cross-sectional view of the "multi-die" structure 700 along line 8—8 in FIG. 7. In particular, semiconductor dies 810 and 812 in structure 800, respectively, correspond to semiconductor dies 710 and 712 in structure 700. Also, substrate signal bond pads 822, 824, 864, and 866, in structure 800, respectively, correspond to substrate signal bond pads 722, 724, 764, and 766, in structure 700. Further, substrate down bond areas 838 and 880, respectively, in structure 800, correspond to substrate down bond areas 738 and 780 in structure 700. Signal bonding wires 814, 816, 860, 862, and 846 in structure 800, respectively, correspond to signal bonding wires 714, 716, 760, 762, and 746 in structure 700, and down bonding wires 836 and 878 in structure 800, respectively, correspond to down bonding wires 736 and 778 in structure 700.

Continuing with FIG. 8, semiconductor die signal bond pads 826, 828, and 852 on semiconductor die 810 in structure 800, respectively, correspond to semiconductor die signal bond pads 726, 728, and 752 on semiconductor die 710 in structure 700. Also, semiconductor die ground bond pad 840 on semiconductor die 810 in structure 800 corresponds to semiconductor die ground bond pad 740 on semiconductor die 710 in structure 700. Additionally, semiconductor die signal bond pads 858, 868, and 870 on semiconductor die 812 in structure 800, respectively, correspond to semiconductor die signal bond pads 758, 769, and 770 on semiconductor die 712 in structure 700. Further, semiconductor die ground pad 882 on semiconductor die 812 in structure 800 corresponds to semiconductor die ground pad 782 on semiconductor die 712 in structure 700.

As seen in FIG. 8, structure 800 is attached to PCB 898. Semiconductor dies 810 and 812, respectively, are attached to die attach pads 802 and 806 by die attach 804 and die attach 808. Die attach pads 802 and 806 are analogous to die attach pad 111 in structure 100 in FIG. 1, and can comprise AUS-5 solder mask. Die attach pads 802 and 806 refer to the segment of the solder mask directly below semiconductor dies 810 and 812. The thickness of die attach pads 802 and 806 can be, for example, 10.0 to 30.0 microns. Die attach 804 and die attach 808 are analogous to die attach 112 in structure 100 in FIG. 1, and can comprise silver-filled epoxy or bismalemide. Generally die attach 804 and die attach 808 can be electrically conductive or electrically insulative, thermoset adhesive, or a combination thereof. However, in the present embodiment, die attach 804 and die attach 808 are electrically and thermally conductive.

As further shown in FIG. 8, solder mask 813 is applied to top surface 818 of substrate 820. Solder mask 813 corresponds to solder mask 113 in structure 100 in FIG. 1, and generally comprises the same material as solder mask 113. Solder mask 813 can be AUS-5; however, solder mask 813 may comprise other materials. Solder mask 815 is also applied to bottom surface 825 of substrate 820, and corresponds to solder mask 115 in structure 100 in FIG. 1. Solder mask 815 can also comprise AUS-5 or other materials. The thicknesses of solder masks 813 and 815 can be, for example, 10.0 to 30.0 microns.

In FIG. 8, a first end of signal bonding wire 814 is bonded to semiconductor die signal bond pad 826 on semiconductor die 810, and a second end of signal bonding wire 814 is bonded to substrate signal bond pad 822. Also, a first end of signal bonding wire 816 is bonded to semiconductor die signal bond pad 828 on semiconductor die 810, and a second end of signal bonding wire 816 is bonded to substrate signal bond pad 824. Substrate signal bond pads 822 and 824, respectively, correspond to substrate signal bond pads 138 and 132 in structure 100 in FIG. 1, and generally comprise the same material as substrate signal bond pads 138 and 132. Substrate signal bond pads 822 and 824 are fabricated on top surface 818 of substrate 820. In structure 800, substrate signal bond pads 822 and 824, respectively, overlap vias 827 and 831. In another embodiment of the present invention, instead of overlapping vias 827 and 831, substrate signal bond pads 822 and 824, respectively, "abut" vias 827 and 831. Signal bonding wires 814 and 816, respectively, correspond to signal bonding wires 140 and 134 in structure 100 in FIG. 1, and generally comprise the same material as signal bonding wires 140 and 134.

Also shown in FIG. 8, a first end of down bonding wire 836 is bonded to semiconductor die ground bond pad 840 on semiconductor 810, and a second end of down bonding wire 836 is bonded to substrate down bond area 838. Substrate down bond area 838 is analogous to substrate down bond area 114 in structure 100 in FIG. 1, and generally comprises the same material as down bond area 114. Substrate down bond area 838 is fabricated on top surface 818 of substrate 820. Down bonding wire 836 is analogous to down bonding wire 116 in structure 100 in FIG. 1, and generally comprises the same material as down bonding wire 116.

As further shown in FIG. 8, a first end of signal bonding wire 846 is bonded to semiconductor die signal bond pad 852 on semiconductor die 810, and a second end of signal bonding wire 846 is bonded to semiconductor die signal bond pad 858 on semiconductor die 812. Signal bonding wire 846 can be gold or can comprise other metals such as aluminum. The diameter of signal bonding wire 846 can be 30.0 microns or other diameter of choice.

In FIG. 8, a first end of signal bonding wire 860 is bonded to semiconductor die signal bond pad 868 on semiconductor die 812, and a second end of signal bonding wire 860 is bonded to substrate signal bond pad 864. Also, a first end of signal bonding wire 862 is bonded to semiconductor die signal bond pad 870 on semiconductor die 812, and a second end of signal bonding wire 862 is bonded to substrate signal bond pad 866. Substrate signal bond pads 864 and 866, respectively, correspond to substrate signal bond pads 822 and 824 in structure 800, and also correspond to substrate signal bond pads 138 and 132 in structure 100 in FIG. 1. Substrate signal bond pads 864 and 866 are fabricated on top surface 818 of substrate 820. In structure 800, substrate signal bond pads 864 and 866 comprise the same material as substrate signal bond pads 822 and 824. In structure 800, substrate signal bond pads 864 and 866, respectively, overlap vias 837 and 841. In another embodiment of the present invention, instead of overlapping vias is 837 and 841, substrate signal bond pads 864 and 866, respectively, "abut" vias 837 and 841. Signal bonding wires 860 and 862, respectively, correspond to signal bonding wires 814 and 816 in structure 800 in FIG. 8, and also to signal bonding wires 140 and 134 in structure 100 in FIG. 1, and generally comprise the same material as signal bonding wires 140 and 134.

Also shown in FIG. 8, a first end of down bonding wire 878 is bonded to semiconductor die ground bond pad 882 on semiconductor die 812, and a second end of down bonding wire 878 is bonded to substrate down bond area 880. In structure 800, substrate down bond area 880 corresponds to substrate down bond area 838, and also to substrate down bond area 114 in structure 100 in FIG. 1. Similar to substrate down bond area 838, substrate down bond area 880 is fabricated on top surface 818 of substrate 820, and comprises the same material as substrate down bond area 838. In structure 800, down bonding wire 878 corresponds to down bonding wire 836, and also to down bonding wire 116 in structure 100 in FIG. 1.

Continuing with FIG. 8, support pads 817 and 819 are fabricated on top surface 818 of substrate 820. Support pads 817 and 819 are analogous to support pad 117 in structure 100 in FIG. 1, and can comprise copper or other metals such as aluminum, molybdenum, tungsten, or gold. Substrate 820 can comprise a two-layer organic laminate such as polytetrafluoroethylene. However, substrate 820 can comprise other organic materials such as FR4 based laminate and BT ("bismallimide triazene"). In one embodiment, substrate 820 can be a ceramic material. In structure 800 in FIG. 8, thickness 823 of substrate 820 is approximately 200.0 microns; however, the thickness of substrate 820 can be different in other embodiments of the invention. Thickness 823 of substrate 820 corresponds to thickness 122 of substrate 120 in structure 100 in FIG. 1.

Continuing with FIG. 8, vias 827, 831, 837, 841, vias 829, and vias 839 are situated within substrate 820. Vias 827 and 837 correspond to via 126 in structure 100 in FIG. 1, and vias 831 and 841 correspond to via 130 in structure 100 in FIG. 1. Vias 829 and vias 839 correspond to vias 128 in structure 100 in FIG. 1. Vias 827, 831, 837, 841, vias 829, and vias 839 extend from top surface 818 to bottom surface 825 of substrate 820, and are filled with copper. However, vias 827, 831, 837, 841, vias 829, and vias 839 can be filled with other metals without departing from the scope of the present invention. In another embodiment of the present invention, vias 827, 831, 837, 841, vias 829, and vias 839 may not be completely filled with a metal.

Also shown in FIG. 8, lands 843, 845, 847, and 849 are fabricated on bottom surface 825 of substrate 820. Lands 843 and 847 correspond to land 144 in structure 100 in FIG. 1, and lands 845 and 849 correspond to land 146 in structure 100 in FIG. 1. Lands 843, 845, 847, and 849 can comprise copper; however, lands 843, 845, 847, and 849 can comprise other metals such as aluminum, molybdenum, tungsten, or gold. Lands 843, 845, 847, and 849, respectively, are attached to PCB 898 by solder 851, 853, 855, and 857. However, other methods known in the art may be used to attach lands 843, 845, 847, and 849 to PCB 898. In structure 800, lands 843, 845, 847, and 849, respectively, overlap vias 827, 831, 837, and 841. In another embodiment of the present invention, instead of overlapping vias 827, 831, 837, and 941, respectively, lands 843, 845, 847, and 849 abut vias 827, 831, 837, and 941.

In the present embodiment of the invention shown in FIG. 8, two separate heat spreaders 859 and 861 are fabricated on bottom surface 825 of substrate 820. Each heat spreader 859 or 861 is analogous to heat spreader 148 in structure 100 in FIG. 1, and generally comprises the same material as heat spreader 148. In structure 800, heat spreaders 859 and 861 can be copper or other metals such as aluminum, molybdenum, tungsten, or gold. In exemplary structure 800, heat spreaders 859 and 861, respectively, are attached to PCB 898 by solders 863 and 865 or by use of other methods known in the art. Finally, it is noted that structure 800 is fabricated using process steps similar to that described in relation to FIG. 5 and, as such, the process steps are not repeated here.

In contrast with the embodiment of the invention illustrated in structure 800, structure 900 illustrates a cross-sectional view of another exemplary multi-die structure in accordance with an embodiment of the present invention which utilizes a single, continuous heat spreader 967 instead of the two separate head spreaders 859 and 861. Structure 900 comprises substrate 920, which corresponds to substrate 820 in structure 800 in FIG. 8.

Figure 9:
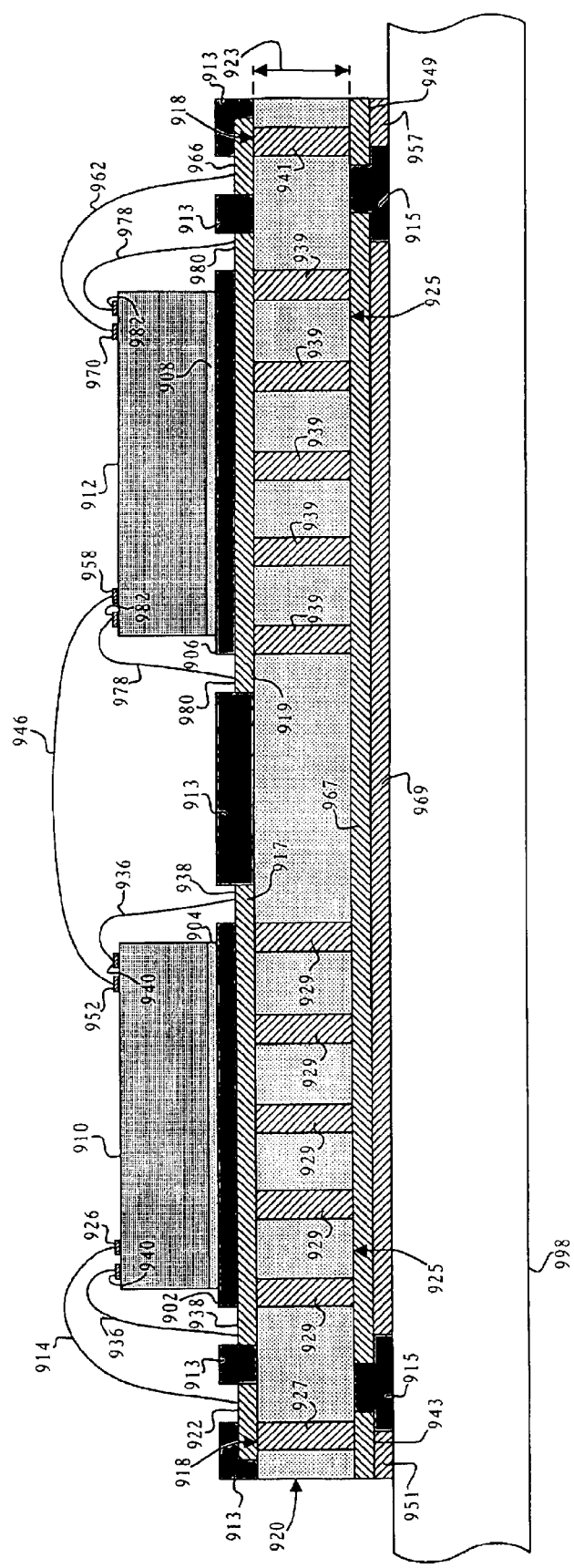
FIG. 9 illustrates a cross-sectional view of a multi-die embodiment of the present invention utilizing a single heat spreader.

In FIG. 9, semiconductor dies 910 and 912 in structure 900, respectively, correspond to semiconductor dies 810 and 812 in structure 800 in FIG. 8. Also, die attach pads 902 and 906 in structure 900, respectively, correspond to die attach pads 802 and 806 in structure 800. Further, die attach 904 and die attach 908 in structure 900, respectively, correspond to die attaches 804 and 808 in structure 800. Also, solder masks 913 and 915 in structure 900, respectively, correspond to solder masks 813 and 815 in structure 800.

Also in FIG. 9, semiconductor die signal bond pads 926 and 952 on semiconductor die 910, respectively, correspond to semiconductor die signal bond pads 826 and 852 on semiconductor die 810 in structure 800 in FIG. 8. Semiconductor die ground bond pad 940 on semiconductor die 910 corresponds to semiconductor die ground pad 840 on semiconductor die 810 in structure 800. Also, semiconductor die signal bond pads 958 and 970 on semiconductor die 912, respectively, correspond to semiconductor die signal bond pads 858 and 870 on semiconductor die 812 in structure 800.

Further shown in FIG. 9, signal bonding wires 914, 946, and 962 in structure 900, respectively, correspond to signal bonding wires 814, 846, and 862 in structure 800 in FIG. 8. Additionally, down bonding wires 936 and 978 in structure 900, respectively, correspond to down bonding wires 836 and 878 in structure 800. Also, substrate signal bond pads 922 and 966 in structure 900, respectively, correspond to substrate signal bond pads 822 and 866 in structure 800. Further, substrate down bond areas 938 and 980 in structure 900, respectively, correspond to substrate down bond areas 838 and 880 in structure 800.

Additionally shown in FIG. 9, support pads 917 and 919 in structure 900, respectively, correspond to support pads 817 and 819 in structure 800 in FIG. 8. Also, vias 927, 941, vias 929, and vias 939 in structure 900, respectively, correspond to vias 827, 841, vias 829, and vias 839 in structure 800, and lands 943 and 949 in structure 900, respectively, correspond to lands 843 and 849 in structure 800. Solders 951 and 957 in structure 900, respectively, correspond to solders 851 and 857 in structure 800.

Now discussing FIG. 9 in detail, structure 900 is shown as attached to PCB 998. Referring to structure 900, semiconductor dies 910 and 912, respectively, are attached to die attach pads 902 and 906 by die attaches 904 and 908. Die attach pads 902 and 906 in structure 900, respectively, generally comprise the same material as die attach pads 802 and 806 in structure 800 in FIG. 8. Also, die attaches 904 and 908, respectively, generally comprise the same material as die attaches 804 and 808 in structure 800. Solder masks 913 and 915, respectively, are applied to top surface 918 and bottom surface 925 of substrate 920. Solder masks 913 and 915, respectively, generally comprise the same materials as solder masks 813 and 815 in structure 800.

Also shown in FIG. 9, a first end of signal bonding wire 914 is bonded to semiconductor die signal bond pad 926 on semiconductor die 910, and a second end of signal bonding wire 914 is bonded to substrate signal bond pad 922. Substrate signal bond pad 922 is fabricated on top surface 918 of substrate 920, and generally comprises the same material as substrate signal bond pad 822 in structure 800 in FIG. 8. Also, signal bonding wire 914 generally comprises the same material as signal bonding wire 814 in structure 800. Further shown in FIG. 9, a first end of down bonding wire 936 is bonded to semiconductor die ground bond pad 940 on semiconductor die 910, and a second end of down bonding wire 936 is bonded to substrate down bond area 938. Substrate down bond area 938 is fabricated on top surface 918 of substrate 920, and generally comprises the same material as substrate down bond area 838 in structure 800. Also, down bonding wire 936 generally comprises the same material as down bonding wire 836 in structure 800.

Further shown in FIG. 9, a first end of signal bonding wire 946 is bonded to semiconductor die signal bond pad 952 on semiconductor die 910, and a second end of signal bonding wire 946 is bonded to semiconductor die signal bond pad 958 on semiconductor die 912. Signal bonding wire 946 generally comprises the same material as signal bonding wire 846 in structure 800 in FIG. 8. Also, a first end of signal bonding wire 962 is bonded to semiconductor die signal bond pad 970 on semiconductor die 912, and a second end of signal bonding wire 962 is bonded to substrate signal bond pad 966. Substrate signal bond pad 966 is fabricated on top surface 918 of substrate 920, and generally comprises the same material as substrate signal bond pad 866 in structure 800 in FIG. 8. Also, signal bonding wire 962 generally comprises the same material as signal bonding wire 862 in structure 800. Also shown in FIG. 9, first end of down bonding wire 978 is bonded to semiconductor die ground bond pad 982 on semiconductor die 912, and a second end of down bonding wire 978 is bonded to substrate down bond area 980. Substrate down bond area 980 is fabricated on top surface 918 of substrate 920, and generally comprises the same material as substrate down bond area 880 in structure 800. Also, down bonding wire 978 generally comprises the same material as down bonding wire 878 in structure 800.

Continuing with FIG. 9, support pads 917 and 919 are fabricated on top surface 918 of substrate 920, and generally comprise the same material as support pads 817 and 819 in structure 800 in FIG. 8. Also, substrate 920 generally comprises the same material as substrate 820. Further shown in FIG. 9, vias 927, 941, vias 929, and vias 939 are situated within substrate 920 and extend from top surface 918 to bottom surface 925 of substrate 920. Also, vias 927, 941, vias 929, and vias 939 generally comprise the same material as vias 827, 841, vias 829, and vias 839 in structure 800 in FIG. 8.

Also shown in FIG. 9, lands 943 and 949 are fabricated on bottom surface 925 of substrate 920, and generally comprise the same material as lands 843 and 849 in structure 800. Lands 943 and 949, respectively, are attached to PCB 998 by solders 951 and 957. However, other methods known in the art may be used to attach lands 943 and 949 to PCB 998. In structure 900, lands 943 and 949, respectively, overlap vias 927 and 941. In another embodiment of the present invention, instead of overlapping vias 927 and 941, respectively, lands 943 and 949 abut vias 927 and 941.

Further shown in FIG. 9, heat spreader 967 is fabricated on bottom surface 925 of substrate 920. In structure 900, heat spreader 967 can be copper; however, heat spreader 967 can comprise other metals such as aluminum, molybdenum, tungsten, or gold. In structure 900, heat spreader 967 is attached to PCB 998 by solder 969. However, other methods known in the art may be used to attach heat spreader 967 to PCB 998. Finally, it is noted that structure 900 is fabricated using process steps similar to that described in relation to FIG. 5 and, as such, the process steps are not repeated here.

The electrical and thermal characteristics of the embodiments of the invention in structures 800 and 900 are, although not identical, similar. As such, the electrical and thermal characteristics of the invention will be discussed in more detail with respect to structure 800 and only the differences between the electrical and thermal characteristics of structures 800 and 900 will be discussed in a later section of this application. In structure 800, down bonding wire 836 provides an electrical ground connection between semiconductor die ground bond pad 840 on semiconductor die 810 and substrate down bond area 838. Substrate down bond area 838 is situated in close proximity to semiconductor die 810. By situating substrate down bond area 838 in close proximity to semiconductor die 810, structure 800 provides a minimal length electrical ground connection between semiconductor die ground bond pad 840 on semiconductor die 810 and substrate down bond area 838.

Semiconductor die ground bond pad 882, substrate down bond area 880, and down bonding wire 878, respectively, are similarly situated relative to semiconductor die 812 as semiconductor die ground bond pad 840, substrate down bond area 838, and down bonding wire 836 are situated relative to semiconductor die 810. Therefore, structure 800 also provides a minimal length electrical ground connection between semiconductor die ground pad 882 on semiconductor die 812 and substrate down bond area 880.

Support pad 817 functions as a "ground plane" for semiconductor die 810 by providing semiconductor die ground bond pads with a large common ground connection. For example, semiconductor die ground pad 840 is electrically connected to substrate down bond area 838 by down bonding wire 836, and substrate down bond area 838 is electrically connected to support pad 817. Thus, support pad 817 provides a common ground connection, i.e. a ground plane, for semiconductor die 810. Since support pad 817 is attached to substrate down bond area 838, structure 800 provides a minimal length electrical ground connection between semiconductor die ground pad 840 and support pad 817. Also, vias 829 electrically connect support pad 817 and heat spreader 859. Thus, substrate down bond area 839, support pad 817, vias 829, and heat spreader 859 combine to provide a minimal length electrical ground connection between semiconductor die ground pad 840 on semiconductor die 810 and heat spreader 859.

Substrate down bond area 880, support pad 819, vias 839, and heat spreader 861, respectively, are similarly situated relative to semiconductor die 812 as substrate down bond area 838, support pad 817, vias 829, and heat spreader 859 are situated relative to semiconductor die 810. Thus, it is manifest that substrate down bond area 880, support pad 819, vias 839, and heat spreader 861 similarly combine to provide a minimal length electrical ground connection between semiconductor die ground pad 882 on semiconductor die 812 and heat spreader 861.

Additionally, in structure 800 in FIG. 8, a large number of vias 829 can be used. Since vias 829 are electrically connected in parallel between support pad 817 and heat spreader 859, they (i.e. vias 829) provide a much lower resistive and inductive path between support pad 817 and heat spreader 859 than the resistive and inductive path that would have been provided by a single via. Thus, through the utilization of multiple vias, such as vias 829 in FIG. 8, structure 800 provides a low resistance, low inductance, minimal length electrical ground connection between support pad 817 and heat spreader 859.

Vias 839, support pad 819, and heat spreader 861, respectively, are similar in function to vias 829, support pad 817, and heat spreader 859. Also, vias 839, support pad 819, and heat spreader 861, respectively, are similarly situated relative to semiconductor die 812 as vias 829, support pad 817, and heat spreader 859 are situated relative to semiconductor die 810. Thus, structure 800 similarly provides a low resistance, low inductance, minimal length electrical ground connection between support pad 819 and heat spreader 861.

One advantage of structure 800 in FIG. 8 is that substrate down bond area 838 is of sufficient size to allow a procedure known as "double bonding" to further minimize the parasitic inductance and resistance generated by down bonding wire 836. In "double bonding," two down bonding wires are connected in parallel between a semiconductor die ground bond pad and a substrate down bond area. In structure 800, for example, two down bonding wires can be connected between semiconductor die ground bond pad 840 on semiconductor die 810 in FIG. 8, and substrate down bond area 838. The parasitic inductance and resistance generated by two parallel down bonding wires between semiconductor die ground bond pad 840 on semiconductor die 810 and substrate down bond area 838 would be approximately one half the parasitic inductance and resistance generated by a single down bonding wire. It is manifest that double bonding can also be accommodated in other embodiments of the invention illustrated in structures 100 and 900.

Substrate down bond area 880 is similar in function to substrate down bond area 838. Also, substrate down bond area 880 is similarly situated relative to semiconductor die 812 as substrate down bond area 838 is situated relative to semiconductor die 810. Therefore, the parasitic inductance and resistance generated by two parallel down bonding wires between semiconductor die ground bond pad 882 on semiconductor die 812 and substrate down bond area 880 would similarly be approximately one half the parasitic inductance and resistance generated by a single down bonding wire.

In the embodiment of the invention shown in FIG. 8, substrate signal bond pads 822 and 824, respectively, overlap vias 827 and 831. Also, lands 843 and 845, respectively, overlap vias 827 and 831. Thus, vias 827 and 831 provide minimal length electrical connections between substrate signal bond pads 822 and 824, respectively, and lands 843 and 845. As such, through the utilization of "overlapping" vias 827 and 831, respectively, structure 800 minimizes the parasitic inductance generated between substrate signal bond pads 822 and 824, and lands 843 and 845. In other words, the fact that no interconnect lines are required to connect to vias 827 and 831 results in a reduction of parasitic inductance and resistance that would otherwise be introduced by the interconnect lines.

Similarly, in structure 800, substrate signal bond pads 864 and 866, respectively, overlap vias 837 and 841. Also, lands 847 and 849, respectively, overlap vias 837 and 841. Thus, vias 837 and 841 provide minimal length electrical connections between substrate signal bond pads 864 and 866, respectively, and lands 847 and 849. As such, through the utilization of "overlapping" vias 837 and 841, respectively, structure 800 also minimizes the parasitic inductance generated between substrate signal bond pads 864 and 866, and lands 847 and 849.

Structure 800 in FIG. 8 provides thermal conduction of excess heat away from semiconductor die 810 by way of support pad 817, vias 829, and heat spreader 859. In structure 800, vias 829 can be filled with a thermally conductive metal such as copper. Adding additional copper to vias 829 increases their the cross-sectional area. Thus, providing a larger cross-sectional area through which heat can be thermally conducted increases the thermal conductivity of vias 829. In structure 800, support pad 817 can be a thermally conductive metal such as copper. Also, the large surface area of support pad 817 provides a large conduit for the conduction of heat generated by semiconductor die 810. Similarly, heat spreader 859 can be a thermally conductive metal such as copper and the large surface area of heat spreader 859 provides a large conduit for the conduction of heat flowing through vias 829. Vias 829 also provide an efficient and "multiple" thermal connection between support pad 817 and heat spreader 859. Thus, through the utilization of support pad 817, vias 829, and heat spreader 859, structure 800 provides an effective mechanism to dissipate heat generated by semiconductor die 810.

Support pad 819, vias 839, and heat spreader 861, respectively, comprise the same materials as support pad 817, vias 829, and heat spreader 859. Also, support pad 819, vias 839, and heat spreader 861, respectively, are similarly situated relative to semiconductor die 812 as support pad 817, vias 829, and heat spreader 859 are situated relative to semiconductor die 810. Thus, through the utilization of support pad 819, vias 839, and heat spreader 861, structure 800 also provides an effective mechanism to dissipate heat generated by semiconductor die 812.

It is noted that a difference may exist in the coefficient of thermal expansion ("CTE") of structure 800 in FIG. 8, and PCB 898 because of a difference in the materials used to fabricate structure 800 and PCB 898. As a result, when structure 800 heats up due to operating or environmental factors, structure 800 may expand at a different rate than PCB 898. The difference in the rate of expansion of structure 800 and PCB 898 creates a corresponding strain on the "solder joint" that connects structure 800 and PCB 898. The "solder joint" comprises the individual solder connections, referred to as solder 851, 853, 855, and 857 in FIG. 8, respectively, between PCB 898 and lands 843, 845, 847, and 849, and the solder connections, referred to as solder 863 and 865, respectively, between PCB 898 and heat spreaders 859 and 861. However, heat spreaders 859 and 861 are much larger in size than lands 843, 845, 847, and 849. The proportionally larger size of heat spreaders 859 and 861 allow heat spreaders 859 and 861 to absorb a corresponding larger amount of the overall strain on their "solder joints." Therefore, heat spreaders 859 and 861 increase the physical reliability of structure 800 by absorbing a large amount of the overall strain on their "solder joints."

The thermal and electrical characteristics of structure 900 in FIG. 9 are similar to the thermal and electrical characteristics of structure 800 in FIG. 8 discussed above. One difference between structure 900 and structure 800 is that structure 900 has a single heat spreader, i.e. heat spreader 967, whereas structure 800 has two heat spreaders, i.e. heat spreaders 859 and 861. As discussed above, the large surface areas of heat spreaders 859 and 861, respectively, provide large conduits for the conduction of heat flowing through vias 829 and vias 839. Similarly, the large surface area of heat spreader 967 provides a large conduit for the conduction of heat flowing through vias 929 and vias 939. Further, as discussed above, parallel vias 829 and parallel vias 839, respectively, provide low resistive and inductive paths between support pads 817 and 819 and heat spreaders 859 and 861. Similarly, parallel vias 929 and parallel vias 939, respectively, provide low resistive and inductive paths between support pads 917 and 919 and heat spreader 967. Moreover, the large size of heat spreader 967 increases the physical reliability of structure 900 by absorbing a large amount of the overall strain on the solder joints connecting PCB 998 to structure 900. However, despite their similarities, structures 800 and 900 each enjoy unique advantages that are discussed below.

One advantage of the single heat spreader structure 900 is that the single heat spreader 967 in structure 900 acts, in effect, as two heat spreaders in parallel. Thus, when compared with the two heat spreader structure 800, the single heat spreader structure 900 further reduces inductive and resistive paths from the ground of PCB 998 to support pads 917 and 919. This reduction in inductive and resistive paths results in less noisy grounds for semiconductor dies 910 and 912 and also ensures that the ground voltage levels in semiconductor dies 910 and 912 do not rise too far above, or fall too far below, zero volts. Another advantage of the single heat spreader structure 900 is that the single heat spreader 967 results in further structural stability since its continuous structure with a larger surface area, as opposed to the discontinuous structure and the smaller collective surface areas existing for the two separate heat spreaders 859 and 861, results in a further reduction of strain on the solder joints connecting PCB 998 to structure 900. Yet another advantage of the single heat spreader structure 900 is that the single heat spreader 967 results in more efficient heat conduction since heat spreader 967 generally has a larger surface area compared to the collective surface areas of the two separate heat spreaders 859 and 861 in structure 800.

One advantage of the two separate heat spreaders 859 and 861 in structure 800 is the fact that the two semiconductor dies 810 and 812 and their respective support pads 817 and 819 and heat spreaders 859 and 861 do not have to be in close proximity of each other as required in structure 900 due to the sharing of the common heat spreader 967. As such, structure 800 permits additional flexibility in the physical locations of semiconductor dies 810 and 812 on PCB 898. This flexibility can be advantageous in various circumstances when for various reasons, such as for ease of wire bonding, it is desirable to separate the physical locations of semiconductor dies 810 and 812 on PCB 898.

An advantage common to both structures 800 and 900 is now discussed by reference to structure 700 of FIG. 7. The various multi-die embodiments of the present invention provide the advantage of permitting semiconductor die signal bond pads on two semiconductor dies to be connected not only directly by bonding wires, but also by "traces" on the top surface of the substrate. For example, semiconductor die signal bond pad 734 on semiconductor die 710 in FIG. 7 can be connected to semiconductor die signal bond pad 776 on semiconductor die 712 through signal bonding wires 730 and 772, substrate signal bond pads 732 and 774, and trace 784 on top surface 718 of substrate 720. One advantage of utilizing trace 784 is that it may result in a shorter, less resistive and less inductive route, than the alternative connection route using vias in substrate 720, lands on the bottom surface of substrate 720, and traces on the printed circuit board connected to the bottom surface of substrate 720. The various multi-die embodiments of the invention provide the ability to run traces, such as trace 784, on the top surface of the substrate without having to run the traces on the surface of the printed circuit board.

In other words, according to the various embodiments of the invention, there is no need for a trace, such as trace 784, to leave top surface 718 of substrate 720, to get routed through a printed circuit board (attached to the bottom surface of substrate 720), and then be routed back on to substrate 720 to reach a desired signal bond pad such as semiconductor die signal bond pad 776. As seen in structure 700, trace 784 can be routed entirely on top surface 718 of substrate 720 without leaving substrate 720. The fact that a trace, such as trace 784, does not have to be routed on the printed circuit board results in shorter, less inductive, and less resistive traces, as well as resulting in a reduced design complexity and a reduced manufacturing cost.

To be sure, other competing technologies, such as the ball grid array ("BGA") technology, might attempt to accommodate the routing of a trace, such as trace 784, on the substrate of a multi-die package, such as the substrate of a multi-die BGA package. However, such competing technologies, for example the BGA technology, require a much larger "foot print" for the multi-die package, such as the footprint required for the multi-die BGA package, as compared to the "footprint" required by structures 700, 800, or 900 in the various embodiments of the present invention. As such, the ability to run a trace, such as trace 784, in the multi-die embodiment of the present invention is a unique advantage common to both structures 800 and 900.

It is appreciated by the above detailed description that the invention provides structure and method for fabrication of a leadless multi-die carrier. The invention provides efficient dissipation of heat generated by the semiconductor dies. Further, the invention provides low parasitics, and a low inductance and resistance ground connection.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. For example, although various embodiments of the present invention were described in relation with structures housing only two dies, it is appreciated by those of skill in the art that the invention's principles apply equally to structures housing more than two dies. The described embodiments are to be considered in all respects as illustrative and not restrictive. It should also be understood that the invention is not limited to the particular embodiments described herein, but is capable of many rearrangements, modifications, and substitutions without departing from the scope of the invention.

Thus, structure and method for fabrication of a leadless multi-die carrier have been described.

What is claimed is:

1. A structure comprising:
    a substrate having a top surface and a bottom surface;
    a first semiconductor die and a second semiconductor die attached to said top surface of said substrate, wherein said first semiconductor die is coupled both to said second semiconductor die and to said substrate;
    a first heat spreader and a second heat spreader attached to said bottom surface of said substrate;
    a first via and a second via in said substrate;
    said first via providing a connection between said first semiconductor die and said first heat spreader, said second via providing a connection between said second semiconductor die and said second heat spreader.

2. The structure of claim 1 wherein said first and second heat spreaders are attached to a printed circuit board.

3. The structure of claim 1 further comprising a first substrate down bond area attached to said top surface of said substrate, wherein said first via provides an electrical connection between said first substrate down bond area and said first heat spreader.

4. The structure of claim 3 wherein a first semiconductor die ground bond pad on said first semiconductor die is electrically connected to said first substrate down bond area by a first down bonding wire.

5. The structure of claim 1 wherein a third via in said substrate provides a connection between a first signal bond pad of said first semiconductor die and a printed circuit board.

6. The structure of claim 1 wherein said substrate comprises organic material.

7. The structure of claim 6 wherein said organic material is selected from the group consisting of polytetrafluoroethylene material and an FR4 based laminate material.

8. The structure of claim 1 wherein said substrate comprises a ceramic material.

9. The structure of claim 5 wherein said third via provides an electrical connection between a first substrate bond pad and said printed circuit board, wherein said first substrate bond pad is electrically connected to said first signal bond pad of said first semiconductor die.

10. The structure of claim 9 wherein said first substrate bond pad overlaps said third via.

11. The structure of claim 9 wherein said first substrate bond pad is electrically connected to said first signal bond pad of said first semiconductor die by a first signal bonding wire.

12. The structure of claim 5 wherein said third via provides an electrical connection between said first signal bond pad of said first semiconductor die and a first land, said first land being electrically connected to said printed circuit board.

13. The structure of claim 12 wherein said third via overlaps said land.

14. A structure comprising:
 a substrate having a top surface and a bottom surface;
 a first semiconductor die and a second semiconductor die attached to said top surface of said substrate, wherein said first semiconductor die is coupled both to said second semiconductor die and to said substrate;
 a heat spreader attached to said bottom surface of said substrate;
 a first via and a second via in said substrate;
 said first via providing a connection between said first semiconductor die and said heat spreader, said second via providing a connection between said second semiconductor die and said heat spreader.

15. The structure of claim 14 wherein said heat spreader is attached to a printed circuit board.

16. The structure of claim 14 further comprising a first substrate down bond area attached to said top surface of said substrate, wherein said first via provides an electrical connection between said first substrate down bond area and said heat spreader.

17. The structure of claim 16 wherein a first semiconductor die ground bond pad on said first semiconductor die is electrically connected to said first substrate down bond area by a first down bonding wire.

18. The structure of claim 14 wherein a third via in said substrate provides a connection between a first signal bond pad of said first semiconductor die and a printed circuit board.

19. The structure of claim 18 wherein said third via provides an electrical connection between a first substrate bond pad and said printed circuit board, wherein said first substrate bond pad is electrically connected to said first signal bond pad of said first semiconductor die.

20. The structure of claim 19 wherein said first substrate bond pad overlaps said third via.

21. The structure of claim 19 wherein said first substrate bond pad is electrically connected to said first signal bond pad of said first semiconductor die by a first signal bonding wire.

22. The structure of claim 18 wherein said third via provides an electrical connection between said first signal bond pad of said first semiconductor die and a first land, said first land being electrically connected to said printed circuit board.

23. The structure of claim 22 wherein said third via overlaps said land.

* * * * *